(12) United States Patent
Shirasaki et al.

(10) Patent No.: US 7,446,338 B2
(45) Date of Patent: Nov. 4, 2008

(54) DISPLAY PANEL

(75) Inventors: Tomoyuki Shirasaki, Higashiyamato (JP); Tsuyoshi Ozaki, Fuchu (JP); Jun Ogura, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 86 days.

(21) Appl. No.: 11/235,579

(22) Filed: Sep. 26, 2005

(65) Prior Publication Data

US 2006/0066535 A1      Mar. 30, 2006

(30) Foreign Application Priority Data

Sep. 29, 2004   (JP) .............................. 2004-283824

(51) Int. Cl.
*H01L 29/04* (2006.01)
(52) U.S. Cl. .............................. 257/72; 257/40; 257/79
(58) Field of Classification Search ................... 257/40, 257/72, 79
See application file for complete search history.

(56) References Cited

U.S. PATENT DOCUMENTS

| 5,684,365 | A | 11/1997 | Tang et al. |
| 6,297,589 | B1 | 10/2001 | Miyaguchi et al. |
| 6,717,357 | B2 | 4/2004 | Okuyama et al. |
| 6,839,057 | B2 | 1/2005 | Iguchi |
| 7,358,529 | B2 | 4/2008 | Childs et al. |
| 7,402,948 | B2 | 7/2008 | Yamazaki et al. |
| 2003/0047730 | A1 | 3/2003 | Konuma |
| 2003/0137325 | A1 | 7/2003 | Yamazaki et al. |
| 2003/0146693 | A1 | 8/2003 | Ishihara et al. |
| 2003/0151355 | A1 | 8/2003 | Hosokawa |
| 2003/0168992 | A1 | 9/2003 | Noguchi et al. |
| 2003/0193056 | A1 | 10/2003 | Takayama et al. |
| 2004/0003939 | A1 | 1/2004 | Nishi et al. |
| 2004/0160170 | A1 | 8/2004 | Sato et al. |
| 2004/0165003 | A1 | 8/2004 | Shirasaki |
| 2004/0256617 | A1 | 12/2004 | Yamada et al. |

(Continued)

FOREIGN PATENT DOCUMENTS

CN              1434668 A        8/2003

(Continued)

OTHER PUBLICATIONS

Related U.S. Appl. No. 11/235,605, filed Sep. 26, 2005; Inventors: Satoru Shimoda et al; Title: Display Panel.

(Continued)

*Primary Examiner*—Long Pham
(74) *Attorney, Agent, or Firm*—Frishauf, Holtz, Goodman & Chick, P.C.

(57) ABSTRACT

A display panel includes a transistor array substrate which has a plurality of pixels and is formed by providing a plurality of transistors for each pixel, each of the transistor having a gate, a gate insulating film, a source, and a drain. A plurality of interconnections are formed to project to a surface of the transistor array substrate and arrayed in parallel to each other. A plurality of pixel electrodes are provided for each pixel and arrayed between the interconnections on the surface of the transistor array substrate along the interconnections. Each of a plurality of light-emitting layers is formed on each pixel electrode. A counter electrode is stacked on the light-emitting layer.

22 Claims, 13 Drawing Sheets

U.S. PATENT DOCUMENTS

| | | |
|---|---|---|
| 2005/0062409 A1 | 3/2005 | Yamazaki et al. |
| 2005/0073264 A1 | 4/2005 | Matsumoto |
| 2005/0088086 A1 | 4/2005 | Park et al. |
| 2005/0258741 A1 | 11/2005 | Kim et al. |
| 2006/0066219 A1 | 3/2006 | Shimoda et al. |

FOREIGN PATENT DOCUMENTS

| | | |
|---|---|---|
| CN | 1437177 A | 8/2003 |
| EP | 1 331 666 A2 | 7/2003 |
| EP | 1 349 208 A1 | 10/2003 |
| JP | 8-330600 A | 12/1996 |
| JP | 2002-195008 A | 7/2001 |
| JP | 2002-352963 A | 12/2002 |
| JP | 2003-076327 A | 3/2003 |
| JP | 2003-186420 A | 7/2003 |
| JP | 2003-288994 A | 10/2003 |
| JP | 2003-317971 A | 11/2003 |
| JP | 2004-258172 A | 9/2004 |
| KR | 2002-0000875 A | 1/2002 |
| KR | 10-2004-0051611 A | 6/2004 |
| TW | 591574 A | 5/2002 |
| TW | 521336 A | 2/2003 |
| TW | 584824 A | 4/2004 |
| TW | 594628 A | 6/2004 |
| WO | WO 03/079441 A1 | 9/2003 |
| WO | 2004/019314 A1 | 3/2004 |

OTHER PUBLICATIONS

Japanese Office Action (and English translation thereof) dated Apr. 30, 2008, issued in a counterpart Japanese Application.

Chinese Office Action (and English translation thereof) dated Jun. 6, 2008, issued in a counterpart Chinese Application.

Chinese Office Action (and English translation thereof) dated Jun. 6, 2008, issued in related U.S. Appl. No. 11/235,605 in counterpart Chinese Application No. 2005800156930.

Japanese Office Action (and English translation thereof) dated Jun. 10, 2008, issued in related U.S. Appl. No. 11/235,605 in counterpart Japanese Application No. 2004-283963.

DISPLAY PANEL

CROSS-REFERENCE TO RELATED APPLICATIONS

This application is based upon and claims the benefit of priority from prior Japanese Patent Application No. 2004-283824, filed Sep. 29, 2004, the entire contents of which are incorporated herein by reference.

BACKGROUND OF THE INVENTION

1. Field of the Invention

The present invention relates to a display panel using a light-emitting element.

2. Description of the Related Art

Organic electroluminescent display panels can roughly be classified into passive driving types and active matrix driving types. Organic electroluminescent display panels of active matrix driving type are more excellent than those of passive driving type because of high contrast and high resolution. In a conventional organic electroluminescent display panel of active matrix display type described in, e.g., Jpn. Pat. Appln. KOKAI Publication No. 8-330600, an organic electroluminescent element (to be referred to as an organic EL element hereinafter), a driving transistor which supplies a current to the organic EL element when a voltage signal corresponding to image data is applied to the gate, and a switching transistor which performs switching to supply the voltage signal corresponding to image data to the gate of the driving transistor are arranged for each pixel. In this organic electroluminescent display panel, when a scan line is selected, the switching transistor is turned on. At this time, a voltage of level representing the luminance is applied to the gate of the driving transistor through a signal line. The driving transistor is turned on. A driving current having a magnitude corresponding to the level of the gate voltage is supplied from the power supply to the organic EL element through the drain-to-source path of the driving transistor. The organic EL element emits light at a luminance corresponding to the magnitude of the current. In the period from the end of scan line selection to the next scan line selection, the level of the gate voltage of the driving transistor is continuously held even after the switching transistor is turned off. Hence, the organic EL element emits light at a luminance corresponding to the magnitude of the driving current corresponding to the voltage.

To drive the organic electroluminescent display panel, a driving circuit is provided around it to apply a voltage to the scan lines, signal lines, and power supply lines laid on the organic electroluminescent display panel.

In the conventional organic electroluminescent display panel of active matrix driving type, interconnections such as a power supply line to supply a current to an organic EL element are patterned simultaneously in the thin-film transistor patterning step by using the material of a thin-film transistor such as a switching transistor or driving transistor. More specifically, in manufacturing the organic electroluminescent display panel, a conductive thin film as a prospective electrode of a thin-film transistor is subjected to photolithography and etching to form the electrode of a thin-film transistor from the conductive thin film. At the same time, an interconnection connected to the electrode is also formed. For this reason, when the interconnection is formed from the conductive thin film, the thickness of the interconnection equals that of the thin-film transistor.

However, the electrode of the thin-film transistor is designed assuming that it functions as a transistor. In other words, the electrode is not designed assuming that it supplies a current to a light-emitting element. Hence, the thin-film transistor is thin literally. If a current is supplied from the interconnection to a plurality of light-emitting elements, a voltage drop occurs, or the current flow through the interconnection delays due to the electrical resistance of the interconnection. To suppress the voltage drop or interconnection delay, the resistance of the interconnection is preferably low. If the resistance of the interconnection is reduced by making a metal layer serving as the source and drain electrodes of the transistor or a metal layer serving as the gate electrode thick, or patterning the metal layers considerably wide to sufficiently flow the current through the metal layers, the overlap area of the interconnection on another interconnection or conductor when viewed from the upper side increases, and a parasitic capacitance is generated between them. This retards the flow of the current. Alternatively, in a so-called bottom emission structure which emits EL light from the transistor array substrate side, light emitted from the EL elements is shielded by the interconnections, resulting in a decrease in opening ratio, i.e., the ratio of the light emission area. If the gate electrode of the thin-film transistor is made thick to lower the resistance, a planarization film (corresponding to a gate insulating film when the thin-film transistor has, e.g., an inverted stagger structure) to eliminate the step of the gate electrode must also be formed thick. This may lead to a large change in transistor characteristic. When the source and drain electrodes are formed thick, the etching accuracy of the source and drain electrodes degrades. This may also adversely affect the transistor characteristic.

BRIEF SUMMARY OF THE INVENTION

It is an object of the present invention to satisfactorily drive a light-emitting element while suppressing any voltage drop and signal delay.

A display panel according to a first aspect of the present invention comprises: a transistor array substrate which has a plurality of pixels and is formed by providing a plurality of transistors for each pixel, each of the transistor having a gate, a gate insulating film, a source, and a drain;

a plurality of interconnections which are formed to project to a surface of the transistor array substrate and arrayed in parallel to each other;

a plurality of pixel electrodes which are provided for each pixel and arrayed between the interconnections on the surface of the transistor array substrate along the interconnections;

a plurality of light-emitting layers each of which is formed on each pixel electrode; and a counter electrode which is stacked on the light-emitting layer.

A display panel according to a second aspect of the present invention comprises: a plurality of pixel electrodes;

a plurality of light-emitting layers which are provided for said plurality of pixel electrodes, respectively;

a counter electrodes which is provided for said plurality of light-emitting layers respectively;

a plurality of driving transistors which are connected to said plurality of pixel electrodes, respectively;

a plurality of switch transistors each of which supplies a write current between a source and drain of a corresponding one of said plurality of driving transistors;

a plurality of holding transistors each of which holds a voltage between the source and a gate of a corresponding one of said plurality of driving transistors;

a plurality of feed interconnections which are formed from a conductive layer different from a layer serving as sources, drains, and gates of said plurality of driving transistors, said plurality of switch transistors, and said plurality of holding transistors and connected to the drains of said plurality of driving transistors;

a plurality of select interconnections each of which selects the switch transistor; and a plurality of common interconnections each of which is connected to the counter electrode.

A display panel according to a third aspect of the present invention comprises: a plurality of pixel electrodes;

a light-emitting layer which is provided for each of said plurality of pixel electrodes;

a counter electrode which is provided for the light-emitting layer;

a driving transistor which is connected to each of said plurality of pixel electrode;

a switch transistor which supplies a write current between a source and drain of the driving transistor;

a holding transistor which holds a voltage between the source and gate of the driving transistor;

a select interconnection which selects the switch transistor;

a common interconnection which is formed from a conductive layer different from a layer serving as sources and drains and a layer serving as gates of the driving transistor, the switch transistor, and the holding transistor and connected to the counter electrode; and a feed interconnection which is formed from a conductive layer different from the layer serving as the sources, drains, and gates of the driving transistor, the switch transistor, and the holding transistor and connected to the drain of the driving transistor and is thicker than the common interconnection.

A display panel according to a fourth aspect of the present invention comprises: a transistor array substrate which is formed by providing a plurality of transistors for each pixel, each transistor having a gate, a gate insulating film, and a source/drain;

a plurality of pixel electrodes which are provided in a plurality of rows on the transistor array substrate;

a first light-emitting layer which is provided on each of said plurality of pixel electrodes of a first row to emit light of a first color;

a second light-emitting layer which is provided on each of said plurality of pixel electrodes of a second row to emit light of a second color;

a third light-emitting layer which is provided on each of said plurality of pixel electrodes of a third row to emit light of a third color;

a counter electrode which is provided on the first light-emitting layer, the second light-emitting layer, and the third light-emitting layer;

a select interconnection which has a top higher than first light-emitting layer, the second light-emitting layer, and the third light-emitting layer and selects at least one of said plurality of transistors;

a common interconnection which has a top higher than first light-emitting layer, the second light-emitting layer, and the third light-emitting layer and is connected to the counter electrode; and a feed interconnection which has a top higher than first light-emitting layer, the second light-emitting layer, and the third light-emitting layer and is connected to said plurality of pixel electrodes of said plurality of transistors.

According to the present invention, since the interconnections can be made thick, the resistance of the interconnections can be reduced. When the resistance of the interconnections decreases, the signal delay and voltage drop can be suppressed.

DETAILED DESCRIPTION OF THE INVENTION

The best mode for carrying out the present invention will be described below with reference to the accompanying drawings. Various kinds of limitations which are technically preferable in carrying out the present invention are added to the embodiments to be described below. However, the spirit and scope of the present invention are not limited to the following embodiments and illustrated examples. In the following description, the term "electroluminescence" will be abbreviated as EL.

[Planar Layout of Display Panel]

Figure 1:
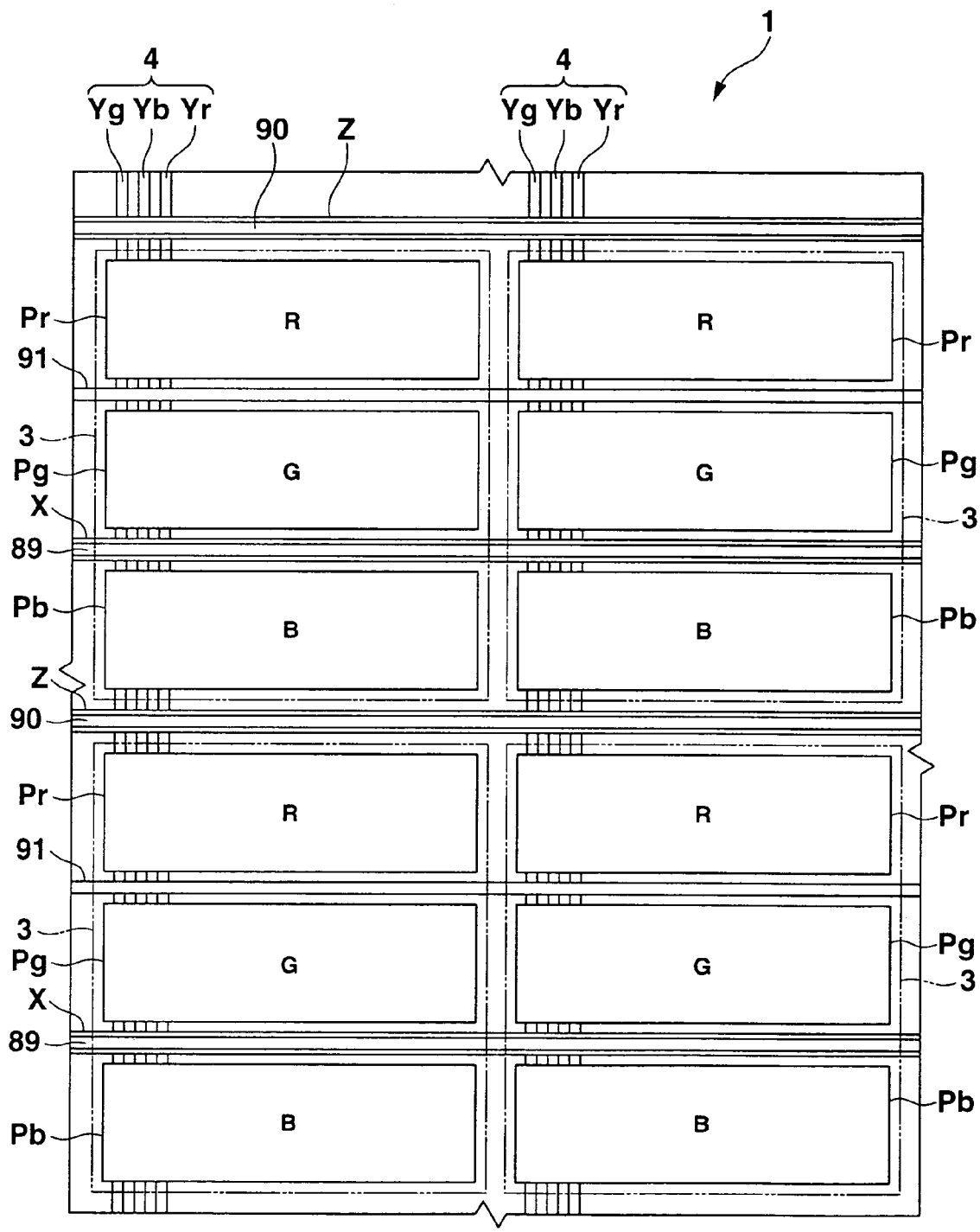
FIG. 1 is a plan view showing four pixels of a display panel 1.

FIG. 1 is a schematic plan view showing adjacent four of a plurality of pixels 3 provided on an insulating substrate 2 of a display panel 1 which is operated by the active matrix driving method. In the display panel 1, as for the pixels in the column direction, a plurality of red sub-pixels Pr are arrayed in the horizontal direction (row direction). A plurality of green sub-pixels Pg are arrayed in the horizontal direction. A plurality of blue sub-pixels Pb are arrayed in the horizontal direction. As for the sequence in the vertical direction (column direction), the red sub-pixel Pr, green sub-pixel Pg, and blue sub-pixel Pb are repeatedly arrayed in this order. The 1-dot red sub-pixel Pr, 1-dot green sub-pixel Pg, and 1-dot blue sub-pixel Pb are combined to form one pixel 3. Such pixels 3 are arrayed in a matrix. In the following description, an arbitrary one of the red sub-pixel Pr, green sub-pixel Pg, and blue sub-pixel Pb is represented by a sub-pixel P. The description of the sub-pixel P applies to all the red sub-pixel Pr, green sub-pixel Pg, and blue sub-pixel Pb.

Three signal lines Yr, Yg, and Yb running in the vertical direction form one set. The combination of the three signal lines Yr, Yg, and Yb is called a signal line group 4. In each signal line group 4, the three signal lines Yr, Yg, and Yb are arranged close to each other. The interval between the adjacent signal line groups 4 is wider than that between the adjacent signal lines Yr, Yg, and Yb in each signal line group 4. One signal line group 4 is provided in correspondence with one column of pixels 3 in the vertical direction. That is, the sub-pixels Pr, Pg, and Pb in one column arrayed in the vertical direction are connected to the signal lines Yr, Yg, and Yb of one signal line group 4, respectively.

The first signal line Yr supplies a signal to all the red sub-pixels Pr of the column of pixels 3 in the vertical direction. The second signal line Yg supplies a signal to all the green sub-pixels Pg of the column of pixels 3 in the vertical direction. The third signal line Yb supplies a signal to all the blue sub-pixels Pb of the column of pixels 3 in the vertical direction.

A plurality of scan lines X run in the horizontal direction. A plurality of supply lines Z, a plurality of select interconnections 89, a plurality of feed interconnections 90, and a plurality of common interconnections 91 are provided in parallel to the scan lines X. One scan line X, one supply line Z, one feed interconnection 90, one select interconnection 89, and one common interconnection 91 are provided in correspondence with one line of pixels 3 in the horizontal direction. More specifically, the common interconnection 91 is arranged between the red sub-pixel Pr and the green sub-pixel Pg which are adjacent in the vertical direction. The scan line X and select interconnection 89 are arranged between the green sub-pixel Pg and the blue sub-pixel Pb which are adjacent in the vertical direction. The supply line Z and feed interconnection 90 are arranged between the blue sub-pixel Pb and the red sub-pixel Pr of the adjacent pixel 3. The select interconnections 89 and feed interconnections 90 have the same thickness.

The scan line X supplies a signal to all the sub-pixels Pr, Pg, and Pb of the pixels 3 of one line arrayed in the horizontal direction. The supply line Z also supplies a signal to all the sub-pixels Pr, Pg, and Pb of the pixels 3 of one line arrayed in the horizontal direction.

When viewed from the upper side, the select interconnection 89 overlaps the scan line X in the running direction and is thus electrically connected to the scan line X. The feed interconnection 90 overlaps the supply line Z in the running direction and is thus electrically connected to the supply line Z.

The color of each the sub-pixels Pr, Pg, and Pb is determined by the color of light emitted from an organic EL element 20 (FIG. 2) (to be described later). The position of each of the sub-pixels Pr, Pg, and Pb, which is represented by a rectangle long in the horizontal direction in FIG. 1, indicates the position of a sub-pixel electrode 20a (in FIG. 2) serving as an anode of the organic EL element 20. More specifically, when the entire display panel 1 is viewed from the upper side, the plurality of sub-pixel electrodes 20a are arrayed in a matrix. The 1-dot sub-pixel P is determined by one sub-pixel electrode 20a. Hence, the plurality of sub-pixel electrodes 20a are arrayed in the horizontal direction between the feed interconnection 90 and the adjacent common interconnection 91. Said plurality of sub-pixel electrodes 20a are arrayed in the horizontal direction between the common interconnection 91 and the adjacent select interconnection 89. Said plurality of sub-pixel electrodes 20a are arrayed in the horizontal direction between the select interconnection 89 and the adjacent feed interconnection 90. When an insulating film which is sufficiently thick so no parasitic capacitance is generated is inserted between the signal line group 4 and the electrode or interconnection located above the signal line group 4, the signal line group 4 may overlap the sub-pixel electrode 20a connected to it when viewed from the upper side. In addition, the signal line group 4 may overlap the sub-pixel electrode 20a of one sub-pixel adjacent to the sub-pixel connected to the signal line group 4 when viewed from the upper side. When the display panel 1 has a bottom emission structure, the signal line group 4 preferably does not overlap the sub-pixel electrode 20a when viewed from the upper side.

When m and n are integers ($m \geq 2$, $n \geq 2$), m pixels 3 are arrayed in the vertical direction, and n pixels 3 are arrayed in the horizontal direction, the sub-pixel electrodes 20a equal in number to the sub-pixels of one column, i.e., (3×m) sub-pixel electrodes 20a are arrayed in the vertical direction. The sub-pixel electrodes 20a equal in number to the sub-pixels of one row, i.e., n sub-pixel electrodes 20a are arrayed in the horizontal direction. In this case, n signal line groups 4 are arranged, and m scan lines X, m supply lines Z, m select interconnections 89, m feed interconnections 90, and m common interconnections 91 are arranged. The total number of select interconnections 89, feed interconnections 90, and common interconnections 91, which also serve as partition walls to prevent leakage of an organic compound-containing solution as a perspective organic EL layer 20b of the organic EL element 20 (to be described later) from the sub-pixels of one row, is (3×m). To partition the organic compound-containing solution in all rows for the sub-pixels of each row, the total number of select interconnections 89, feed interconnections 90, and common interconnections 91 must be (3×m+1). To do this, a (3×m+1)th partition dummy interconnection having the same height and same length as the common interconnection 91 is arranged in the row direction in parallel to the select interconnections 89, feed interconnections 90, and common interconnections 91. The select interconnections 89, feed interconnections 90, and common interconnections 91 are used as partition walls, their top portions are higher than the organic EL layer 20b and the liquid level of the organic compound-containing solution.

[Circuit Arrangement of Sub-Pixel]

Figure 2:
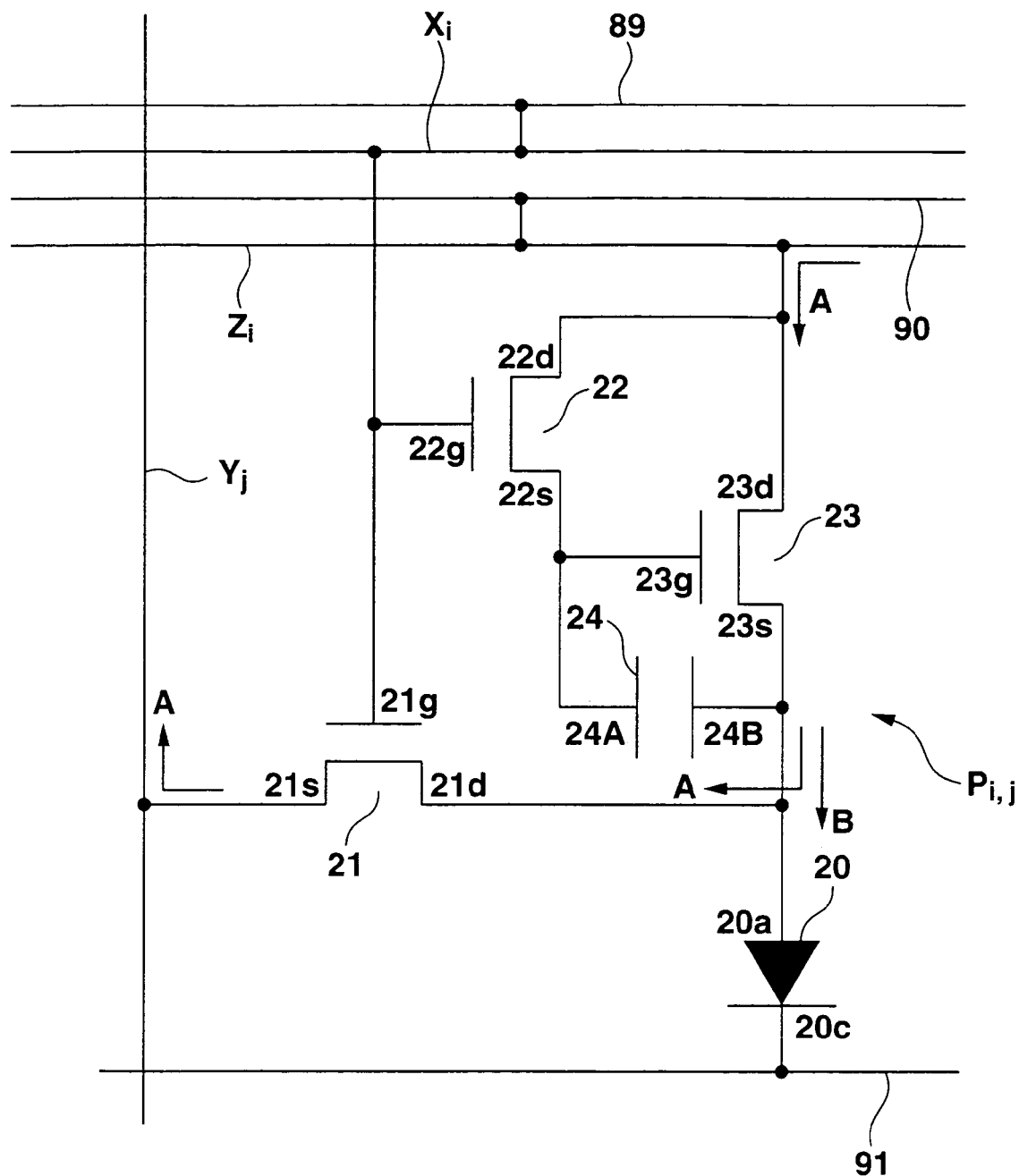
FIG. 2 is an equivalent circuit diagram of a sub-pixel P of the display panel 1.

The circuit arrangement of the first to third sub-pixels Pr, Pg, and Pb will be described next with reference to the equivalent circuit diagram in FIG. 2. All the sub-pixels Pr, Pg, and Pb have the same arrangement. The organic EL element 20, first to third N-channel amorphous silicon thin-film transistors (to be simply referred to as transistors hereinafter) 21, 22, and 23, and a capacitor 24 are provided for the 1-dot sub-pixel $P_{i,j}$. The first transistor 21 will be referred to as the switch transistor 21, the second transistor 22 will be referred to as the holding transistor 22, and the third transistor 23 will be referred to as the driving transistor 23 hereinafter. In FIG. 2 and the following description, the signal line Y for the red sub-pixel Pr represents the signal line Yr in FIG. 1, the signal line Y for the green sub-pixel Pg represents the signal line Yg in FIG. 1, and the signal line Y for the blue sub-pixel Pb represents the signal line Yb in FIG. 1.

In the switch transistor 21, a source 21s is electrically connected to the signal line $Y_j$. A drain 21d is electrically connected to the sub-pixel electrode 20a of the organic EL element 20, a source 23s of the driving transistor 23, and an upper electrode 24B of the capacitor 24. A gate 21g is electrically connected to a gate 22g of the holding transistor 22, the scan line $X_i$, and the select interconnection 89.

In the holding transistor 22, a source 22s is electrically connected to a gate 23g of the driving transistor 23 and a lower electrode 24A of the capacitor 24. A drain 22d is electrically connected to a drain 23d of the driving transistor 23 and the supply line $Z_i$. The gate 22g is electrically connected to the gate 21g of the switch transistor 21 and the scan line $X_i$.

In the driving transistor 23, the source 23s is electrically connected to the sub-pixel electrode 20a of the organic EL element 20, the drain 21d of the switch transistor 21, and the electrode 24B of the capacitor 24. The drain 23d is electrically connected to the drain 22d of the holding transistor 22 and the supply line $Z_i$. The gate 23g is electrically connected to the source 22s of the holding transistor 22 and the lower electrode 24A of the capacitor 24.

A counter electrode 20c serving as a cathode of the organic EL element 20 is electrically connected to the common interconnection 91.

The sources 21s of the switch transistors 21 of all the red sub-pixels Pr arrayed in a line in the vertical direction are electrically connected to the common signal line Yr. The sources 21s of the switch transistors 21 of all the green sub-pixels Pg arrayed in a line in the vertical direction are electrically connected to the common signal line Yg. The sources 21s of the switch transistors 21 of all the blue sub-pixels Pb arrayed in line in the vertical direction are electrically connected to the common signal line Yb.

The gates 21g of the switch transistors 21 of all the sub-pixels Pr, Pg, and Pb of the pixels 3 of one row, which are arrayed in the horizontal direction, are electrically connected to the common scan line X. The gates 22g of the holding transistors 22 of all the sub-pixels Pr, Pg, and Pb of the pixels 3 of one row, which are arrayed in the horizontal direction, are electrically connected to the common scan line X. The drains 22d of the holding transistors 22 of all the sub-pixels Pr, Pg, and Pb of the pixels 3 of one row, which are arrayed in the horizontal direction, are electrically connected to the common supply line Z. The drains 23d of the driving transistors 23 of all the sub-pixels Pr, Pg, and Pb of the pixels 3 of one row, which are arrayed in the horizontal direction, are electrically connected to the common supply line Z.

[Planar Layout of Pixel]

Figure 3:
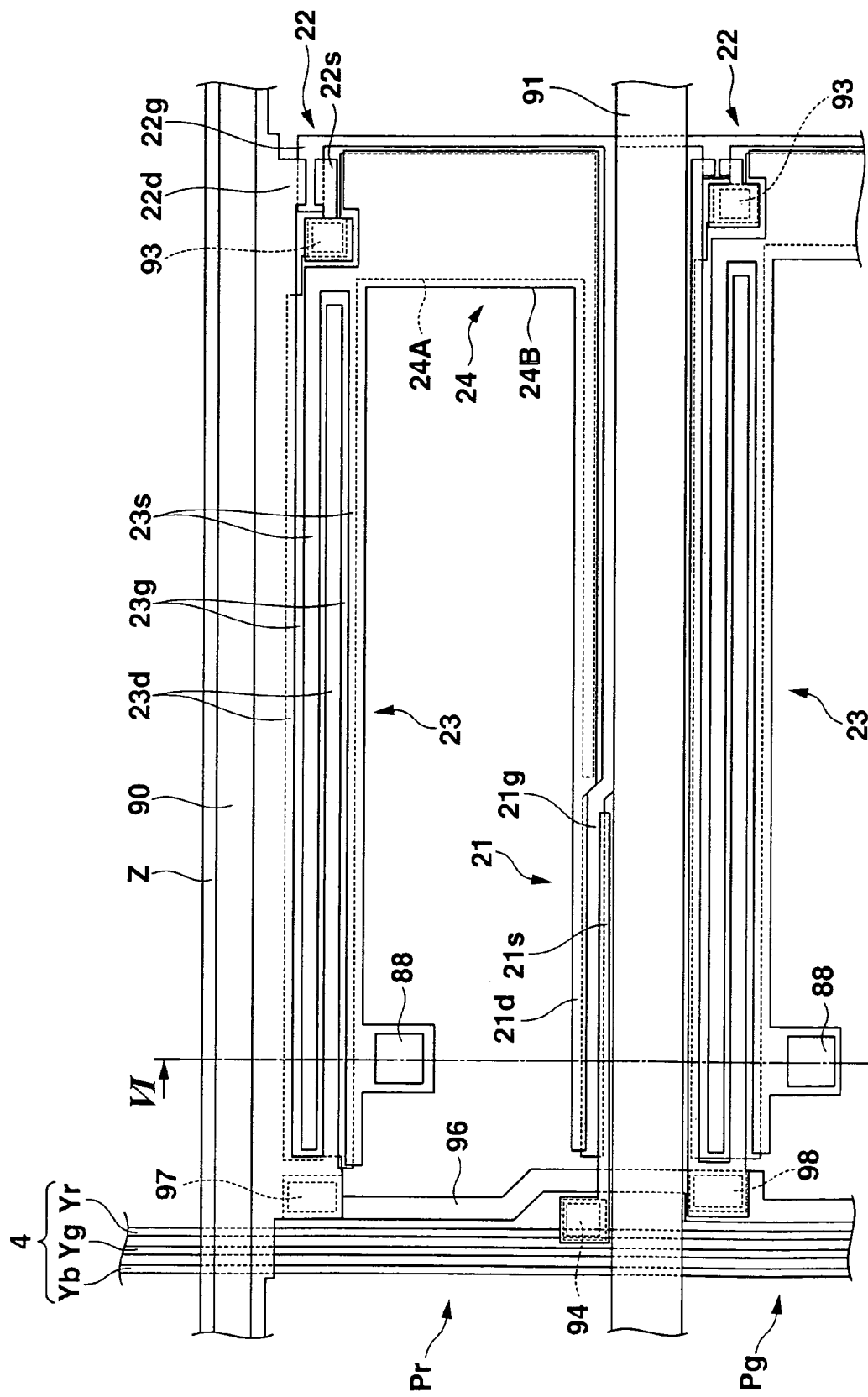
FIG. 3 is a plan view showing the electrodes of a red sub-pixel Pr.
Figure 4:
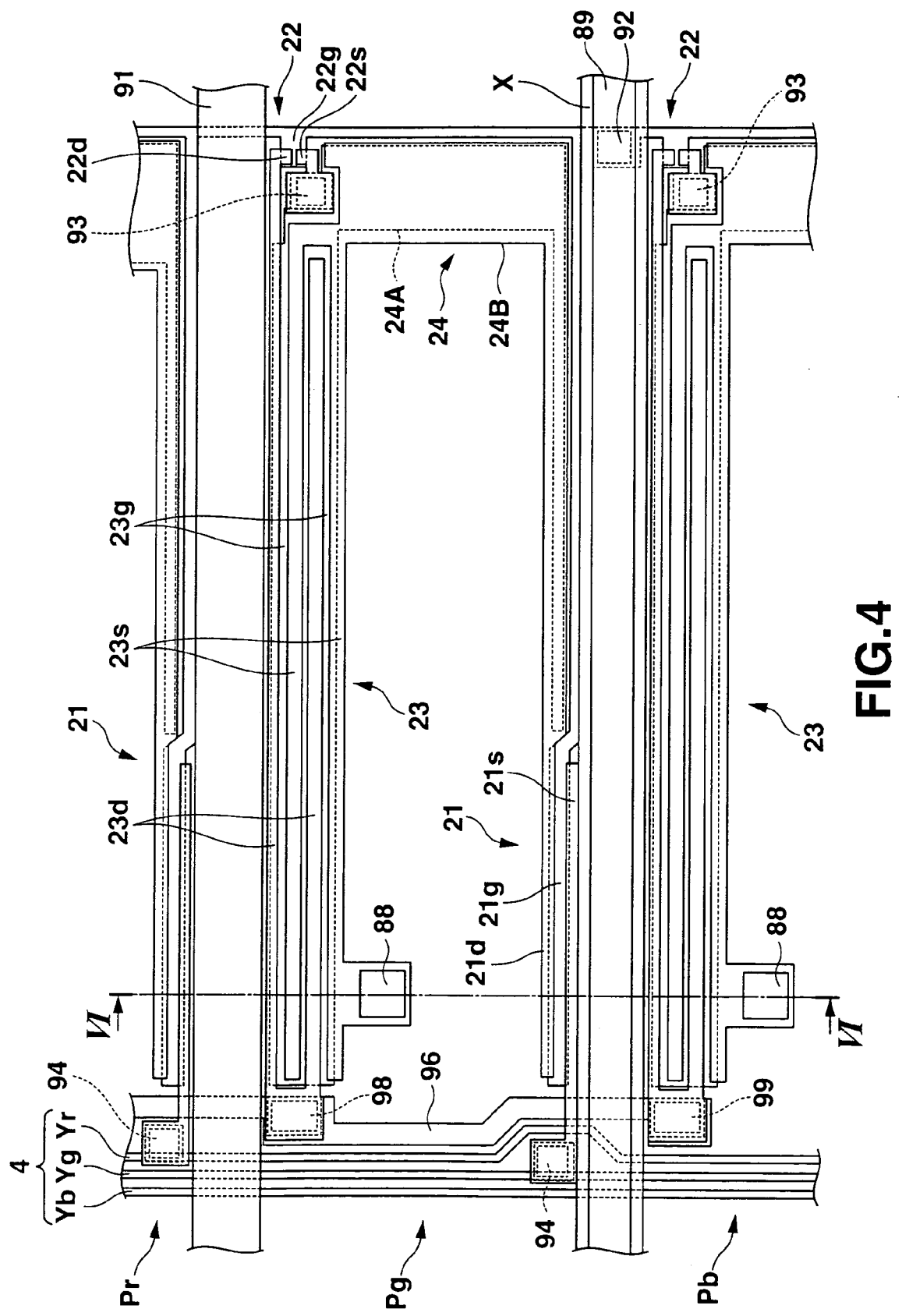
FIG. 4 is a plan view showing the electrodes of a green sub-pixel Pg.
Figure 5:
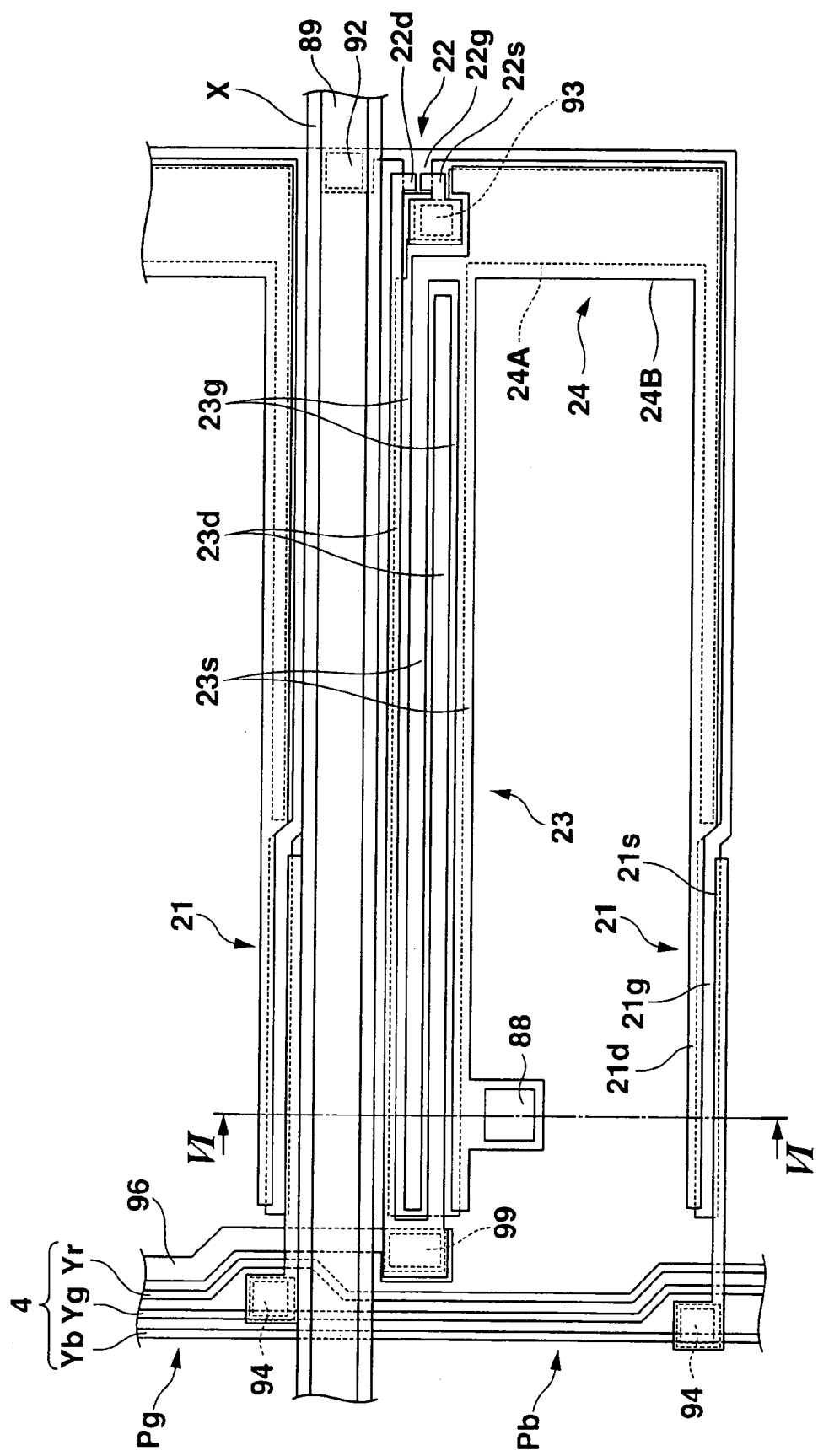
FIG. 5 is a plan view showing the electrodes of a blue sub-pixel Pb.

The planar layout of the pixel 3 will be described with reference to FIGS. 3 to 5. FIG. 3 is a plan view mainly showing the electrodes of the red sub-pixel Pr. FIG. 4 is a plan view mainly showing the electrodes of the green sub-pixel Pg. FIG. 5 is a plan view mainly showing the electrodes of the blue sub-pixel Pb. For the illustrative convenience, FIGS. 3 to 5 do not illustrate the sub-pixel electrode 20a and counter electrode 20c of the organic EL element 20.

As shown in FIG. 3, in the red sub-pixel Pr viewed from the upper side, the driving transistor 23 is arranged along the supply line Z and feed interconnection 90. The switch transistor 21 is arranged along the common interconnection 91. The holding transistor 22 is arranged at a corner of the red sub-pixel Pr near the supply line Z.

As shown in FIG. 4, in the green sub-pixel Pg viewed from the upper side, the driving transistor 23 is arranged along the common interconnection 91. The switch transistor 21 is arranged along the scan line X and select interconnection 89. The holding transistor 22 is arranged at a corner of the green sub-pixel Pg near the common interconnection 91.

As shown in FIG. 5, in the blue sub-pixel Pb viewed from the upper side, the driving transistor 23 is arranged along the scan line X. The switch transistor 21 is arranged along the supply line Z and feed interconnection 90 of the next row. The holding transistor 22 is arranged at a corner of the blue sub-pixel Pb near the scan line X.

As shown in FIGS. 3 to 5, in all the sub-pixels Pr, Pg, and Pb, the capacitor 24 is arranged along the signal line group 4 of the next column.

When a focus is placed on only the switch transistors 21 of all the sub-pixels Pr, Pg, and Pb in the entire display panel 1 viewed from the upper side, the plurality of switch transistors 21 are arrayed in a matrix. When a focus is placed on only the holding transistors 22 of all the sub-pixels Pr, Pg, and Pb, the plurality of holding transistors 22 are arrayed in a matrix. When a focus is placed on only the driving transistors 23 of all the sub-pixels Pr, Pg, and Pb, the plurality of driving transistors 23 are arrayed in a matrix.

[Layer Structure of Display Panel]

Figure 6:
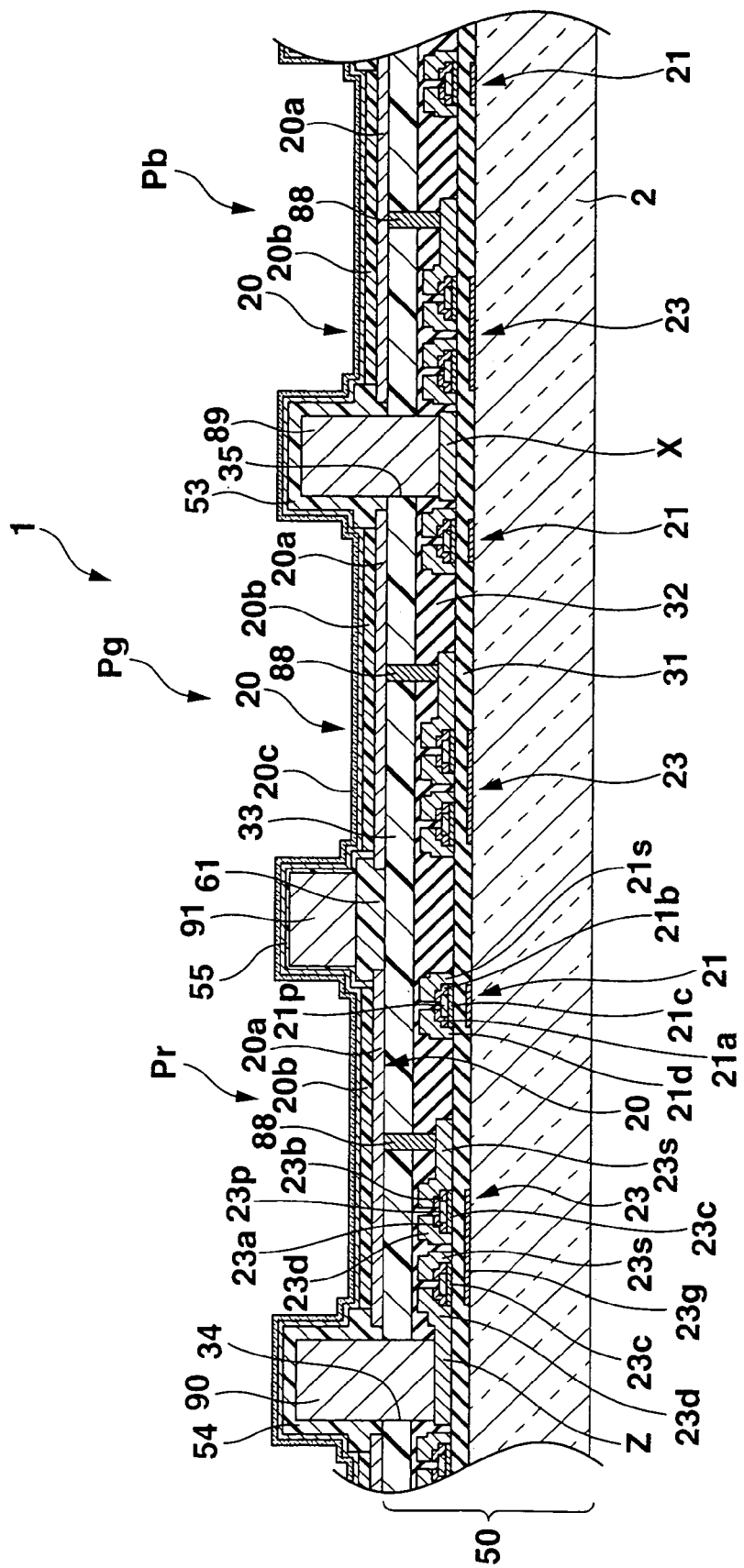
FIG. 6 is a sectional view taken along a line VI-VI in FIGS. 3 to 5.

The layer structure of the display panel 1 will be described with reference to FIG. 6. FIG. 6 is a sectional view taken along a line VI-VI in FIGS. 3 to 5.

The display panel 1 is formed by stacking various kinds of layers on the insulating substrate 2 which is optically transparent. The insulating substrate 2 has a flexible sheet shape or a rigid plate shape.

The layer structure of the first to third transistors 21 to 23 will be described first. As shown in FIG. 6, the switch transistor 21 includes the gate 21g, part of a gate insulating film 31, a semiconductor film 21c, a channel protective film 21p, impurity-doped semiconductor films 21a and 21b, the drain 21d, and the source 21s. The gate 21g is formed on the insulating substrate 2. The part of the gate insulating film 31 is formed on the gate 21g. The semiconductor film 21c opposes the gate 21g via the part of the gate insulating film 31. The channel protective film 21p is formed on the central portion of the semiconductor film 21c. The impurity-doped semiconductor films 21a and 21b are formed on two end portions of the semiconductor film 21c to be spaced apart from each other and partially overlap the channel protective film 21p. The drain 21d is formed on the impurity-doped semiconductor film 21a. The source 21s is formed on the impurity-doped semiconductor film 21b. The drain 21d and source 21s can have either a single-layer structure or a layered structure including two or more layers.

The driving transistor 23 includes the gate 23g, part of the gate insulating film 31, a semiconductor film 23c, a channel protective film 23p, impurity-doped semiconductor films 23a and 23b, the drain 23d, and the source 23s. The gate 23g is formed on the insulating substrate 2. The part of the gate insulating film 31 is formed on the gate 23g. The semiconductor film 23c opposes the gate 23g via the part of the gate insulating film 31. The channel protective film 23p is formed on the central portion of the semiconductor film 23c. The impurity-doped semiconductor films 23a and 23b are formed on two end portions of the semiconductor film 23c to be spaced apart from each other and partially overlap the channel protective film 23p. The drain 23d is formed on the impurity-doped semiconductor film 23a. The source 23s is formed on the impurity-doped semiconductor film 23b. When viewed from the upper side as shown in FIGS. 3 to 5, the driving transistor 23 is formed into an interdigital shape so that the channel width is large. The drain 23d and source 23s can have either a single-layer structure or a layered structure including two or more layers.

The holding transistor 22 has the same layer structure as the driving transistor 23, and its sectional view is not illustrated. In all the sub-pixels Pr, Pg, and Pb, the switch transistor 21, holding transistor 22, and driving transistor 23 have the same layer structures as described above.

The layer structure of the capacitor 24 will be described next (FIGS. 3 to 5). The capacitor 24 has the lower electrode 24A, a part of the gate insulating film 31, and the upper electrode 24B. The lower electrode 24A is directly formed on the insulating substrate 2. The gate insulating film 31 is formed on the lower electrode 24A. The upper electrode 24B opposes the lower electrode 24A via a part of the gate insulating film 31. In all the sub-pixels Pr, Pg, and Pb, the capacitors 24 have the same layer structures as described above.

The relationship between the layers of the transistors 21 to 23 and capacitor 24, the signal lines Y, the scan lines X, and supply lines Z will be described next with reference to FIGS. 3 to 6.

Connection lines 96, the gates 21g of the switch transistors 21, the gates 22g of the holding transistors 22, the gates 23g of the driving transistors 23, the lower electrodes 24A of the capacitors 24 of all the sub-pixels Pr, Pg, and Pb, and all the signal lines Yr, Yg, and Yb are formed, using photolithography and etching, by patterning a conductive film formed on the entire surface of the insulating substrate 2. The conductive film as the base of the connection lines 96, gates 21g of the switch transistors 21, the gates 22g of the holding transistors 22, the gates 23g of the driving transistors 23, the electrodes 24A of the capacitors 24, and the signal lines Yr, Yg, and Yb will be referred to as a gate layer hereinafter.

The gate insulating film 31 is an insulating film common to the first to third transistors 21, 22, 23, and capacitors 24 of all the sub-pixels Pr, Pg, and Pb and is formed on the entire surface. Hence, the gate insulating film 31 covers the gates 21g, 22g, 23g of the transistors 21, 22, 23, the lower electrodes 24A of the capacitors 24, and the signal lines Yr, Yg, and Yb.

The drains 21d, 22d, 23d and sources 21s, 22s, 23s of the transistors 21, 22, 23, the upper electrodes 24B of the capacitors 24 of all the sub-pixels Pr, Pg, and Pb, and all the scan lines X and supply lines Z are formed, using photolithography and etching, by patterning a conductive film formed on the entire surface of the gate insulating film 31. The conductive film as the base of the drains 21d and sources 21s of the switch transistors 21, the drains 22d and sources 22s of the holding transistors 22, the drains 23d and sources 23s of the driving transistors 23, the upper electrodes 24B of the capacitors 24, the scan lines X, and the supply lines Z will be referred to as a drain layer hereinafter.

One contact hole 92 is formed for each pixel 3 in the gate insulating film 31 at a portion overlapping the scan line X. The gate 21g of the switch transistor 21 and the gate 22g of the holding transistor 22 of each of the sub-pixels Pr, Pg, and Pb are electrically connected to the scan line X through the contact hole 92. Another contact hole 94 is formed for each 1-dot sub-pixel P in the gate insulating film 31 at a portion overlapping the signal line Y. In all the sub-pixels Pr, Pg, and Pb, the source 21s of the switch transistor 21 is electrically connected to the signal line Y through the contact hole 94 (i.e. conductor baried in the hole). One contact hole 93 is formed for each 1-dot sub-pixel P in the gate insulating film 31 at a portion overlapping the lower electrode 24A. In all the sub-pixels Pr, Pg, and Pb, the source 22s of the holding transistor 22 is electrically connected to the gate 23g of the driving transistor 23 and the lower electrode 24A of the capacitor 24.

In the red sub-pixel Pr, the drains 22d, 23d of the second and third transistors 22, 23 are integrated with the supply line Z. In the green sub-pixel Pg and blue sub-pixel Pb, the drains 22d, 23d of the transistors 22, 23 are provided separately from the supply line Z. The drains 22d, 23d of the transistors 22, 23 are electrically connected to the supply line Z in the following way.

One connection line 96 is provided for one pixel 3 to run through the pixel 3 in the vertical direction. The connection line 96 is formed by patterning the gate layer and is covered with the gate insulating film 31. A contact hole 97 is formed in the gate insulating film 31 at a portion where the supply line Z overlaps the connection line 96. The connection line 96 is electrically connected to the supply line Z through the contact hole 97. In the green sub-pixel Pg, a contact hole 98 is formed in the gate insulating film 31 at a portion where the connection line 96 overlaps the drain 23d of the driving transistor 23. The connection line 96 is electrically connected to the drain 23d of the driving transistor 23 through the contact hole 98. In the blue sub-pixel Pb, a contact hole 99 is formed in the gate insulating film 31 at a portion where the connection line 96 overlaps the drain 23d of the driving transistor 23. The connection line 96 is electrically connected to the drain 23d of the driving transistor 23 through the contact hole 99. In both the green sub-pixel Pg and the blue sub-pixel Pb, the drains 22d, 23d of the transistors 22, 23 are electrically connected to the supply line Z and feed interconnection 90 through the connection line 96.

The switch transistors 21, holding transistors 22, driving transistors 23 of all the sub-pixels Pr, Pg, and Pb, and all the scan lines X and supply lines Z are covered with a protective insulating film 32 formed on the entire surface and made of silicon nitride or silicon oxide. The protective insulating film 32 is divided into rectangles at portions overlapping the scan lines X and supply lines Z. This will be described later in detail.

A planarization film 33 is formed on the protective insulating film 32 so that the three-dimensional pattern of the first to third transistors 21, 22, 23, scan lines X, and supply lines Z is eliminated by the planarization film 33. That is, the surface of the planarization film 33 is flat. The planarization film 33 is formed by hardening a photosensitive resin such as polyimide. The planarization film 33 is divided into rectangles at portions overlapping the scan lines X and supply lines Z. This will be described later in detail.

To use the display panel 1 as a bottom emission type, i.e., to use the insulating substrate 2 as the display screen, transparent materials are used for the gate insulating film 31, protective insulating film 32, and planarization film 33. The layered structure from the insulating substrate 2 to the planarization film 33 is called a transistor array substrate 50.

An insulating line 61 parallel to the scan line X is formed on the surface of the planarization film 33, i.e., on the surface of the transistor array substrate 50 between the red sub-pixel Pr and the green sub-pixel Pg. The insulating line 61 is formed by hardening a photosensitive resin such as polyimide. The common interconnection 91 narrower than the insulating line 61 is formed on the insulating line 61. The common interconnection 91 is formed by electroplating and is therefore formed to be much thicker than the signal line Y, scan line X, and supply line Z and project upward from the surface of the planarization film 33. The common interconnection 91 preferably contains at least one of copper, aluminum, gold, and nickel.

A liquid repellent conductive layer 55 having water repellency/oil repellency is formed on the surface of each common interconnection 91. The liquid repellent conductive layers 55 are formed by reducing and eliminating hydrogen atoms (H) of the thiol group (—SH) of triazyl-trithiol expressed by chemical formula (1), and oxidizing and adsorbing sulfur atoms (S) in the surfaces of the common interconnections 91.

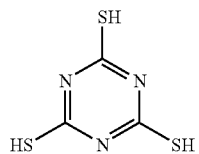

The liquid repellent conductive layer 55 is a film made of a layer of triazyl-trithiol molecules which are regularly arranged on the surface of the common interconnection 91. For this reason, the liquid repellent conductive layer 55 has a very low resistance and conductivity. To make the water repellency/oil repellency more effective, a material in which an alkyl fluoride group substitutes for one or two thiol groups of triazyl-trithiol may be used in place of triazyl-trithiol.

Trenches 34 open and long in the horizontal direction are formed in the protective insulating film 32 and planarization film 33 to penetrate both films at portions overlapping the supply lines Z. Trenches 35 open and long in the horizontal direction are formed in the protective insulating film 32 and planarization film 33 to penetrate both films at portions overlapping the scan lines X. The protective insulating film 32 and planarization film 33 are divided into rectangles by the trenches 34 and 35. The feed interconnections 90 are buried in the trenches 34 so that the feed interconnections 90 are formed on the supply lines Z in the trenches 34 and electrically connected to the supply lines Z. The select interconnections 89 are buried in the trenches 35 so that the select interconnections 89 are formed on the scan lined X in the trenches 35 and electrically connected to the scan lines X.

The select interconnections 89 and feed interconnections 90 are formed by electroplating and are therefore much thicker than the signal lines Y, scan lines X, and supply lines Z. The thickness of the select interconnection 89 and feed interconnection 90 is larger than the total thickness of the protective insulating film 32 and planarization film 33 so that the select interconnection 89 and feed interconnection 90 project upward from the upper surface of the planarization film 33. Both the select interconnection 89 and the feed interconnection 90 preferably contain at least one of copper, aluminum, gold, and nickel. A hydrophobic insulating film 53 having water repellency and/or oil repellency is formed on the outer surface of a portion of the select interconnection 89, extending from the film 33. A hydrophobic insulating film 54 having water repellency and/or oil repellency is formed on the outer surface of a portion of the feed interconnection 90, extending from film 33.

The plurality of sub-pixel electrodes 20a are arrayed in a matrix on the upper surface of the planarization film 33, i.e., the upper surface of the transistor array substrate 50. The sub-pixel electrodes 20a are formed, using photolithography and etching, by patterning a transparent conductive film formed on the entire surface of the planarization film 33.

The sub-pixel electrode 20a is an electrode functioning as the anode of the organic EL element 20. More specifically, the sub-pixel electrode 20a preferably has a relatively high work function so that holes can efficiently be injected in the organic EL layer 20b (to be described later). In a bottom emission structure, the sub-pixel electrode 20a is transparent to visible light. The sub-pixel electrode 20a is formed by using, as the major component, e.g., indium tin oxide (ITO), indium zinc oxide, indium oxide ($In_2O_3$), tin oxide ($SnO_3$), zinc oxide (ZnO), or cadmium tin oxide (CTO).

To use the display panel 1 as a top emission type, i.e., to use the opposite side of the insulating substrate 2 as the display screen, a reflecting film having high conductivity and high visible light reflectance is preferably formed between the sub-pixel electrode 20a and the planarization film 33. Alternatively, the sub-pixel electrode 20a itself is preferably formed as a reflecting electrode.

One contact hole 88 is formed for each 1-dot sub-pixel P in the planarization film 33 and protective insulating film 32 at a portion overlapped with the sub-pixel electrode 20a. A conductive pad is buried in the contact hole 88. In each of all the sub-pixels Pr, Pg, and Pb, the sub-pixel electrode 20a is electrically connected to the upper electrode 24B of the capacitor 24, the drain 21d of the switch transistor 21, and the source 23s of the driving transistor 23.

The organic EL layer 20b of the organic EL element 20 is formed on the sub-pixel electrode 20a. The organic EL layer 20b is a light-emitting layer of broad sense. The organic EL layer 20b contains a light-emitting material (phosphor) as an organic compound. The organic EL layer 20b has a two-layer structure in which a hole transport layer and a light-emitting layer of narrow sense are formed sequentially from the sub-pixel electrode 20a. The hole transport layer is made of PEDOT (polythiophene) as a conductive polymer and PSS (polystyrene sulfonate) as a dopant. The light-emitting layer of narrow sense is made of a polyfluorene-based light-emitting material.

In the red sub-pixel Pr, the organic EL layer 20b emits red light. In the green sub-pixel Pg, the organic EL layer 20b emits green light. In the blue sub-pixel Pb, the organic EL layer 20b emits blue light.

The organic EL layer 20b is independently provided for each sub-pixel electrode 20a. When viewed from the upper side, said plurality of organic EL layers 20b are arrayed in a matrix. All sub-pixels of one row, which are arrayed in the horizontal direction between the feed interconnection 90 and the common interconnection 91, are the red sub-pixels Pr. Hence, said plurality of sub-pixel electrodes 20a arrayed in the horizontal direction between the feed interconnection 90 and the common interconnection 91 may be covered with the common organic EL layer 20b for red light emission, which has a long band shape in the horizontal direction. At this time, the organic EL layer 20b has such an electric resistance that no current flows to the organic EL layer 20b adjacent in the horizontal direction. Similarly, the plurality of sub-pixel electrodes 20a arrayed in the horizontal direction between the common interconnection 91 and the select interconnection 89 may be covered with the common organic EL layer 20b for green light emission, which has a long band shape in the horizontal direction. The plurality of sub-pixel electrodes 20a arrayed in a predetermined row in a line in the horizontal direction between the select interconnection 89 and the feed interconnection 90 of the next row (one row after) may be covered with the common organic EL layer 20b for blue light emission, which has a long band shape in the horizontal direction.

The organic EL layer 20b is formed by wet coating (e.g., ink-jet method) after coating of the hydrophobic insulating film 54 and liquid repellent conductive layer 55. In this case, an organic compound-containing solution containing an organic compound as the prospective organic EL layer 20b is applied to the sub-pixel electrode 20a. The liquid level of the organic compound-containing solution is higher than the top of the insulating line 61. The thick select interconnection 89, feed interconnection 90, and common interconnection 91 whose tops are much higher than that of the insulating line 61 are formed between the sub-pixel electrodes 20a adjacent in the vertical direction to project respect to the surface of the transistor array substrate 50. Hence, the organic compound-containing solution applied to a sub-pixel electrode 20a is prevented from leaking to the sub-pixel electrodes 20a adjacent in the vertical direction. In addition, the select interconnection 89, feed interconnection 90, and common interconnection 91 are respectively coated with the hydrophobic insulating film 53, hydrophobic insulating film 54, and liquid repellent conductive layer 55 having water repellency and/or oil repellency, which repel the organic compound-containing solution applied to the sub-pixel electrode 20a. The organic compound-containing solution applied to the sub-pixel electrode 20a is never deposited excessively thick near the end of the liquid repellent conductive layer 55, the end of the hydrophobic insulating film 53, and the end of the hydrophobic insulating film 54 as compared to the center of the sub-pixel electrode 20a. Hence, the organic EL layer 20b formed by drying the organic compound-containing solution can have a uniform thickness in a plane.

The organic EL layer 20b need not always have the above-described two-layer structure. A three-layer structure including a hole transport layer, a light-emitting layer of narrow sense, and an electron transport layer formed sequentially from the sub-pixel electrode 20a may be employed. Alternately, a single-layer structure including a light-emitting layer of narrow sense may be used. A layered structure having an electron or hole injection layer inserted between appropriate layers in one of the above layer structures may be employed. Any other layered structures can also be used.

The counter electrode 20c functioning as the cathode of the organic EL element 20 is formed on the organic EL layers 20b. The counter electrode 20c is a common electrode commonly formed on the entire surface for all the sub-pixels Pr, Pg, and Pb. The counter electrode 20c is formed on the entire surface and covers the common interconnections 91 via the liquid repellent conductive layers 55. For this reason, as shown in the circuit diagram in FIG. 2, the counter electrode 20c is electrically connected to the common interconnections 91. Each select interconnection 89 is coated with the hydrophobic insulating film 53. Each feed interconnection 90 is coated with the hydrophobic insulating film 54. Hence, the counter electrode 20c is insulated from both the select interconnections 89 and the feed interconnection 90.

The counter electrode 20c is preferably formed from a material having a work function lower than the sub-pixel electrode 20a, and for example, a single substance or an alloy containing at least one of magnesium, calcium, lithium, barium, indium, and a rare earth metal. The counter electrode 20c may have a layered structure in which the layers of various kinds of materials described above are stacked, or a layered structure in which a metal layer hard to oxidize is deposited in addition to the layers of various kinds of materials described above to lower the sheet resistance. More specifically, a layered structure including a highly pure barium layer having a low work function and provided on the interface side contacting the organic EL layer 20b, and an aluminum layer provided to cover the barium layer, or a layered structure including a lithium layer on the lower side and an aluminum layer on the upper side can be used. In a top emission structure, the counter electrode 20c may be a transparent electrode having the above-described thin film with a low work function and a transparent conductive film made of, e.g., ITO on the thin film.

A sealing insulating film 56 is formed on the counter electrode 20c. The sealing insulating film 56 is an inorganic or organic film provided to cover the entire counter electrode 20c and prevent any degradation of the counter electrode 20c.

Conventionally, in an EL display panel having a top emission structure, at least part of the counter electrode 20c is formed as a transparent electrode of, e.g., a metal oxide having a high resistance value. Such a material can sufficiently reduce the sheet resistance only by increasing the thickness. When the material is thick, the transparency of the organic EL element decreases inevitably. As the screen size becomes large, a uniform potential can hardly be obtained in a plane, and the display characteristic becomes poor.

In this embodiment, however, the plurality of common interconnections 91 with a low resistance are provided to obtain a sufficient thickness in the horizontal direction. Hence, the sheet resistance value of the entire cathode electrodes of the organic EL elements 20 can be decreased together with the counter electrode 20c so that a sufficiently large current can be supplied uniformly in a plane. In this structure, the common interconnection 91 reduce the sheet resistance of the cathode electrode. For this reason, the transmittance can be increased by forming the counter electrode 20c thin. In a top emission structure, the pixel electrode 20a may be made of a reflecting material.

The feed interconnections 90 which are formed by using a thick conductive layer except the conductive layer to form the thin-film transistors are electrically connected to the supply lines $Z_1$ to $Z_m$. For this reason, the delay until the write current or driving current (to be described later) in the plurality of organic EL elements 20 reaches a predetermined current value, which is caused by the voltage drop in the supply lines $Z_1$ to $Z_m$ formed by only the conductive layer of the thin-film transistors, can be prevented, and the elements can satisfactorily be driven.

In addition, the select interconnections 89 which are formed by using a thick conductive layer except the conductive layer to form the thin-film transistors are electrically connected to the scan lines $X_1$ to $X_m$. For this reason, the signal delay caused by the voltage drop in the scan lines $X_1$ to $X_m$ formed by only the conductive layer of the thin-film transistors can be prevented, and the switch transistors 21 and holding transistors 22 can be switched quickly and driven satisfactorily.

[Display Panel Driving Method]

Figure 7:
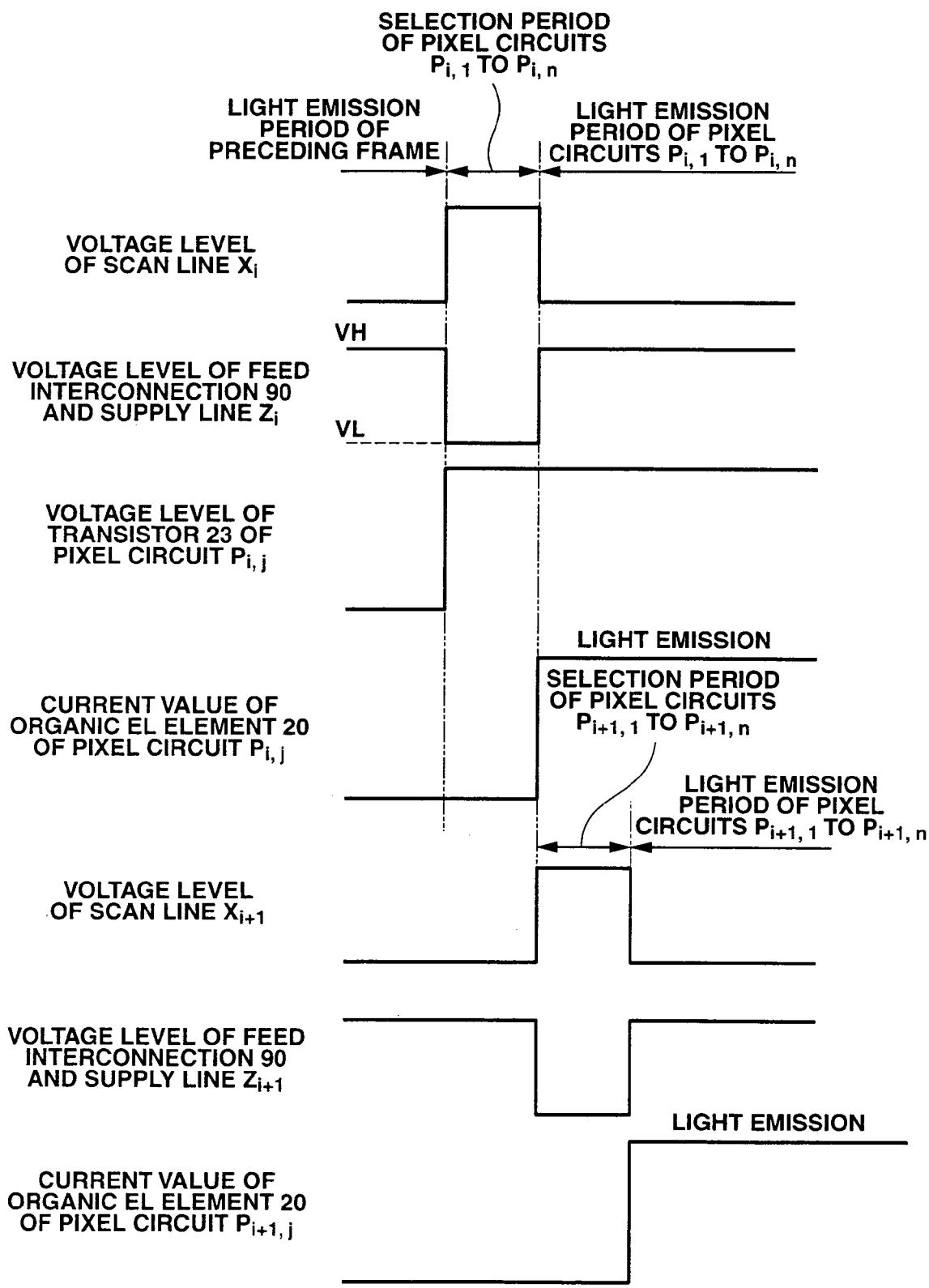
FIG. 7 is a timing chart for explaining a driving method of the display panel 1.

The display panel 1 can be driven by the active matrix method in the following way. As shown in FIG. 7, a select driver connected to the scan lines $X_1$ to $X_m$ sequentially outputs a shift pulse of high level to the scan lines $X_1$ to $X_m$ in this order (the scan line $X_1$ next to the scan line $X_m$), thereby sequentially selecting the scan lines $X_1$ to $X_m$. A feed driver is connected to the feed interconnections 90. The feed driver applies a write feed voltage VL to supply a write current to the driving transistors 23 connected to the supply lines $Z_1$ to $Z_m$ through the feed interconnections 90 in a selection period. The feed driver applies a driving feed voltage VH to supply a driving current to the organic EL elements 20 through the driving transistors 23 in a light emission period. The feed driver sequentially outputs the write feed voltage VL of low level (lower than the voltage of the counter electrode of the organic EL elements 20) to the supply lines $Z_1$ to $Z_m$ in this order (the supply line $Z_1$ next to the supply line $Z_m$) in synchronism with the select driver, thereby sequentially selecting the supply lines $Z_1$ to $Z_m$. While the select driver is selecting the scan lines $X_1$ to $X_m$, a data driver supplies a write current (current signal) to all the signal lines $Y_1$ to $Y_n$ through the drain-to-source paths of the driving transistors 23 of a predetermined row. At this time, the feed driver outputs the write feed voltage VL of low level from both the interconnection terminals at the two ends of each feed interconnection 90, located on the left and right ends of the insulating substrate 2 to the feed interconnections 90 connected to the supply lines $Z_1$ to $Z_m$. The counter electrode 20c and common interconnections 91 are connected to an external device through the interconnection terminals portions and held at a predetermined common potential Vcom (e.g., ground=0 V).

The direction in which the signal lines $Y_1$ to $Y_n$ run is called the vertical direction (column direction). The direction in which the scan lines $X_1$ to $X_m$ run is called the horizontal direction (row direction). In this case, m and n are natural numbers (m≧2, n≧2). The subscript added to the scan line X represents the sequence from the top in FIG. 1. The subscript added to the supply line Z represents the sequence from the top in FIG. 1. The subscript added to the signal line Y represents the sequence from the left in FIG. 1. The first subscript added to the pixel circuit P represents the sequence from the top, and the second subscript represents the sequence from the left. More specifically, let i be an arbitrary natural number of 1 to m, and j be an arbitrary natural number of 1 to n. A scan line $X_i$ is the ith row from the top, a supply line $Z_i$ is the ith row from the top, a signal line $Y_j$ is the jth column from the left, and a pixel circuit $P_{i,j}$ is located on the ith row from the top and the jth column from the left. The pixel circuit $P_{i,j}$ is connected to the scan line $X_i$, supply line $Z_i$, and signal line $Y_j$.

The pixel circuit $P_{i,j}$ comprises the organic EL element 20 serving as a pixel, the first to third N-channel amorphous silicon thin-film transistors (to be simply referred to as transistors hereinafter) 21, 22, and 23 arranged around the organic EL element 20, and the capacitor 24.

In each selection period, the potential on the data driver side is equal to or lower than the write feed voltage VL output to the feed interconnections 90 and the supply lines $Z_1$ to $Z_m$. The write feed voltage VL is set to be equal to or lower than the common potential Vcom. At this time, no current flows from the organic EL elements 20 to the signal lines $Y_1$ to $Y_n$. As shown in FIG. 2, a write current (pull-out current) having a current value corresponding to the gray level is supplied from the data driver to the signal lines $Y_1$ to $Y_n$, as indicated by an arrow A. In the pixel circuit $P_{i,j}$, the write current (pull-out current) to the signal line $Y_j$ flows from the feed interconnection 90 and supply line $Z_i$ through the drain-to-source path of the driving transistor 23 and the drain-to-source path of the switch transistor 21. The current value of the current flowing through the drain-to-source path of the driving transistor 23 is uniquely controlled by the data driver. The data driver sets the current value of the write current (pull-out current) in accordance with an externally input gray level. While the write current (pull-out current) is flowing, the voltage between the gate 23g and source 23s of the driving transistor 23 of each of pixel circuits $P_{i,1}$ to $P_{i,n}$ of the ith row is forcibly set in accordance with the current value of the write current (pull-out current) flowing to the signal lines $Y_1$ to $Y_n$, i.e., the current value of the write current (pull-out current) flowing between the drain 23d and source 23s of the driving transistor 23 independently of the change over time in the Vg-Ids characteristic of the driving transistor 23. Charges with a magnitude corresponding to the level of this voltage are stored in the capacitor 24 so that the current value of the write current (pull-out current) is converted into the voltage level between the gate 23g and source 23s of the driving transistor 23. In the subsequent light emission period, the scan line $X_i$ changes to low level so that the switch transistor 21 and holding transistor 22 are turned off. The charges on the side of the electrode 24A of the capacitor 24 are confined by the holding transistor 22 in the OFF state, and a floating state is set. Hence, even when the voltage of the source 23s of the driving transistor 23 is modulated at the time of transition from the selection period to the light emission period, the potential difference between the gate 23g and source 23s of the driving transistor 23 is maintained. In the light emission period, the potential of the supply line $Z_i$ and the feed interconnection 90 connected to it equals the driving feed voltage VH which is higher than the potential Vcom of the counter electrode 20c of the organic EL element 20. Hence, a driving current flows from the supply line $Z_i$ and the feed interconnection 90 connected to it to the organic EL element 20 in the direction of arrow B through the driving transistor 23. Hence, the organic EL element 20 emits light. The current value of the driving current depends on the voltage between the gate 23g and source 23s of the driving transistor 23. For this reason, the current value of the driving current in the light emission period equals the current value of the write current (pull-out current) in the selection period.

Figure 8:
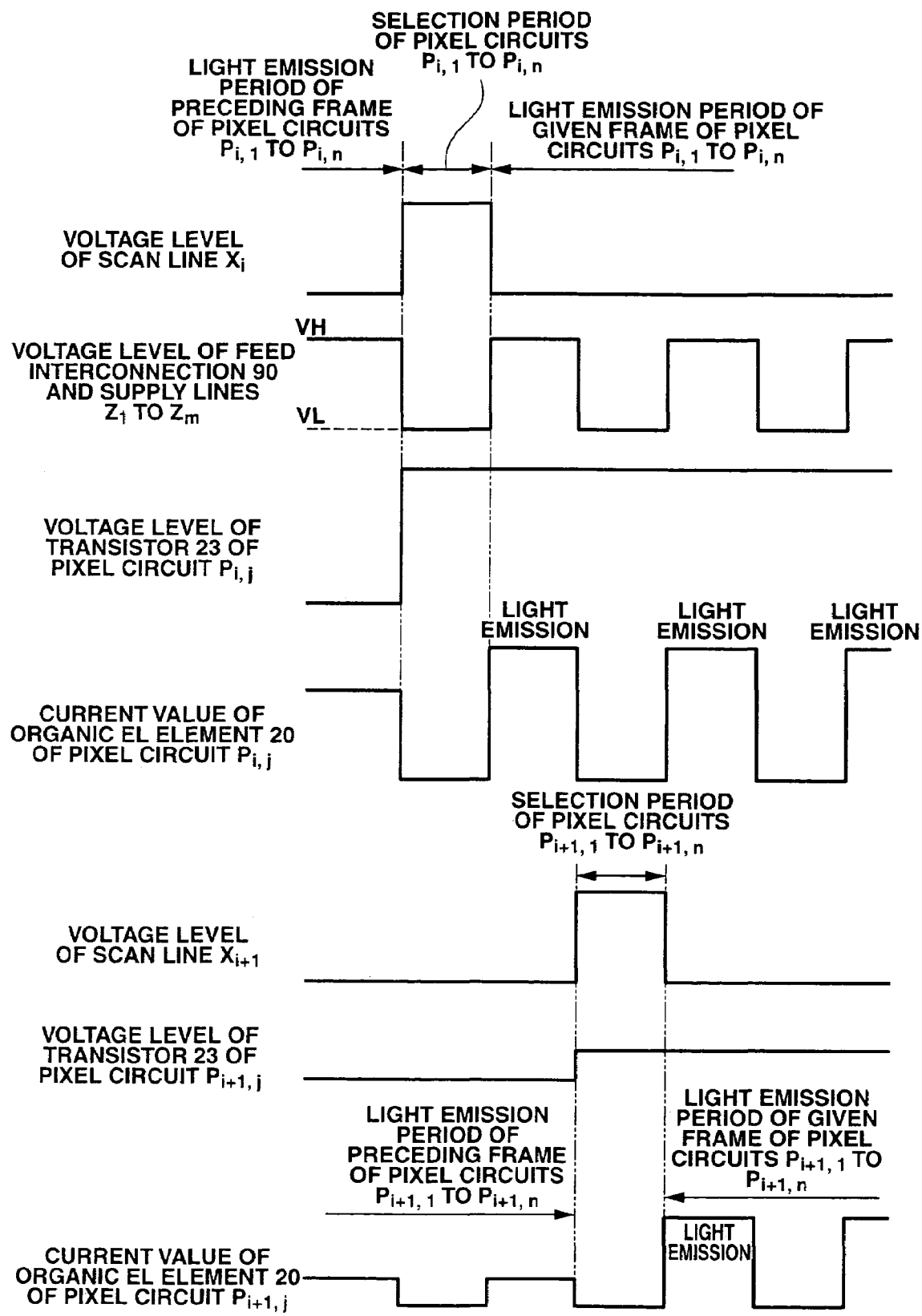
FIG. 8 is a timing chart for explaining another driving method of the display panel 1.

Another active matrix driving method of the display panel 1 will be described next. As shown in FIG. 8, an oscillation circuit outputs a clock signal to the feed interconnections 90 and thus supply lines $Z_1$ to $Z_m$. The select driver sequentially outputs a shift pulse of high level to the scan lines $X_1$ to $X_m$ in this order (the scan line $X_1$ next to the scan line $X_m$), thereby sequentially selecting the scan lines $X_1$ to $X_m$. While the select driver is outputting the shift pulse to one of the scan lines $X_1$ to $X_m$, the clock signal from the oscillation circuit changes to low level. When the select driver selects the scan lines $X_1$ to $X_m$, the data driver supplies a pull-out current (current signal) as the write current to all the signal lines $Y_1$ to $Y_n$ through the drain-to-source paths of the driving transistors 23. The counter electrode 20c and feed interconnections 90 are held at the predetermined common potential Vcom (e.g., ground=0 V).

In the selection period of the scan line $X_i$, the shift pulse is output to the scan line $X_i$ of the ith row so that the switch transistor 21 and holding transistor 22 are turned on. In each selection period, the potential on the data driver side is equal to or lower than the clock signal output to the feed interconnections 90 and supply lines $Z_1$ to $Z_m$. The low level of the clock signal is set to be equal to or lower than the common potential Vcom. At this time, no current flows from the organic EL elements 20 to the signal lines $Y_1$ to $Y_n$. As shown in FIG. 2, a write current (pull-out current) having a current value corresponding to the gray level is supplied from the data driver to the signal lines $Y_1$ to $Y_n$, as indicated by the arrow A. In the pixel circuit $P_{i,j}$, the write current (pull-out current) to the signal line $Y_j$ flows from the feed interconnection 90 and supply line $Z_i$ through the drain-to-source path of the driving transistor 23 and the drain-to-source path of the switch transistor 21. The current value of the current flowing through the drain-to-source path of the driving transistor 23 is uniquely controlled by the data driver. The data driver sets the current value of the write current (pull-out current) in accordance with an externally input gray level. While the write current (pull-out current) is flowing, the voltage between the gate 23g and source 23s of the driving transistor 23 of each of the pixel circuits $P_{i,1}$ to $P_{i,n}$ of the ith row is forcibly set in accordance with the current value of the write current (pull-out current) flowing to the signal lines $Y_1$ to $Y_n$, i.e., the current value of the write current (pull-out current) flowing between the drain 23d and source 23s of the driving transistor 23 independently of the change over time in the Vg-Ids characteristic of the transistor 23. Charges with a magnitude corresponding to the level of this voltage are stored in the capacitor 24 so that the current value of the write current (pull-out current) is converted into the voltage level between the gate 23g and source 23s of the driving transistor 23. In the subsequent light emission period, the scan line $X_i$ changes to low level so that the switch transistor 21 and holding transistor 22 are turned off. The charges on the side of the electrode 24A of the capacitor 24 are confined by the holding transistor 22 in the OFF state, and a floating state is set. Hence, even when the voltage of the source 23s of the driving transistor 23 is modulated at the time of transition from the selection period to the light emission period, the potential difference between the gate 23g and source 23s of the driving transistor 23 is maintained. Of the selection period, in a period in which no row is selected, i.e., the clock signal is at high level, and the potential of the feed interconnection 90 and supply line $Z_i$ is higher than the potential Vcom of the counter electrode 20c of the organic EL element 20 and the feed interconnection 90, the driving current flows from the feed interconnection 90 and thus supply line $Z_i$ with a higher potential to the organic EL element 20 through the drain-to-source path of the driving transistor 23 in the direction of arrow B. Hence, the organic EL element emits light. The current value of the driving current depends on the voltage between the gate 23g and source 23s of the driving transistor 23. For this reason, the current value of the driving current in the light emission period equals the current value of the write current (pull-out current) in the selection period. Of the selection period, in a period in which any row is selected, i.e., the clock signal is at low level, the potential of the feed interconnection 90 and thus supply line $Z_i$ is equal to or lower than the potential Vcom of the counter electrode 20c and feed interconnection 90. Hence, no driving current flows to the organic EL element 20, and no light emission occurs.

In either driving method as described above, the switch transistor 21 functions to turn on (selection period) and off (light emission period) of the current between the signal line $Y_j$ and the source 23s of the driving transistor 23. The holding transistor 22 functions to make it possible to supply the current between the source 23s and drain 23d of the driving transistor 23 in the selection period and hold the voltage between the gate 23g and source 23s of the transistor 23 in the light emission period. The driving transistor 23 functions to drive the organic EL element 20 by supplying a current having a magnitude corresponding to the gray level to the organic EL element 20.

As described above, the magnitude of the current flowing to the feed interconnection 90 equals the sum of the magnitudes of driving currents flowing to the n organic EL elements 20 connected to the supply line $Z_i$ of one column. When a selection period to do moving image driving using pixels for VGA or more is set, the parasitic capacitance of each feed interconnection 90 increases. The resistance of an interconnection formed from a thin film which forms the gate electrode or the source/drain electrode of a thin-film transistor is so high that the write current (driving current) cannot be supplied to the n organic EL elements 20. In this embodiment, the feed interconnections 90 are formed from a conductive layer different from the gate electrodes or the source/drain electrodes of thin-film transistors of the pixel circuits $P_{i,1}$ to $P_{m,n}$. For this reason, the voltage drop by the feed interconnections 90 is small. Even in a short selection period, the write current (pull-out current) can sufficiently be supplied without any delay. Since the resistance of the feed interconnection 90 is lowered by thickening it, the feed interconnection 90 can be made narrow. In a bottom emission structure, the decrease in pixel opening ratio can be minimized.

Similarly, the magnitude of the driving current flowing to the common interconnection 91 in the light emission period equals that of the write current (pull-out current) flowing to the feed interconnection 90 in the selection period. Since the common interconnections 91 use a conductive layer different from the gate electrodes or the source/drain electrodes of the first to third thin-film transistors of the pixel circuits $P_{i,1}$ to $P_{m,n}$, the common interconnection 91 can be made sufficiently thick, and its resistance can be lowered. In addition, even when the counter electrode 20c itself becomes thin and increases its resistance, the voltage of the counter electrode 20c can be uniformed in a plane. Hence, even if the same potential is applied to all the pixel electrodes 20a, the light emission intensities of the organic EL layers 20b almost equal, and the light emission intensity in a plane can be uniformed.

When the EL display panel 1 is used as a top emission type, the counter electrode 20c can be made thinner. Hence, light emitted from the organic EL layer 20b hardly attenuates while passing through the counter electrode 20c. Additionally, since the common interconnections 91 are respectively provided between the pixel electrodes 20a adjacent in the horizontal direction when viewed from the upper side, the decrease in pixel opening ratio can be minimized.

[Widths, Sectional Areas, and Resistivities of Feed Interconnection and Common Interconnection]

When the display panel is driven by the latter of the above-described two driving methods, the feed interconnections 90 are electrically connected to each other by the first lead interconnection arranged at one edge of the insulating substrate 2 and are therefore set to an equipotential by the external clock signal. The first lead interconnection is connected to the interconnection terminals at the two ends of the insulating substrate 2. Since the voltages applied from external driving circuits to the interconnection terminals are equipotential, the current can quickly be supplied to all the feed interconnections 90.

The common interconnections 91 are connected to each other by the second lead interconnection arranged at an edge different from the edge of the insulating substrate 2 where the first lead interconnection is provided. A common voltage Vss is applied to the common interconnections 91. The second lead interconnection is insulated from the first lead interconnection.

Figure 9:
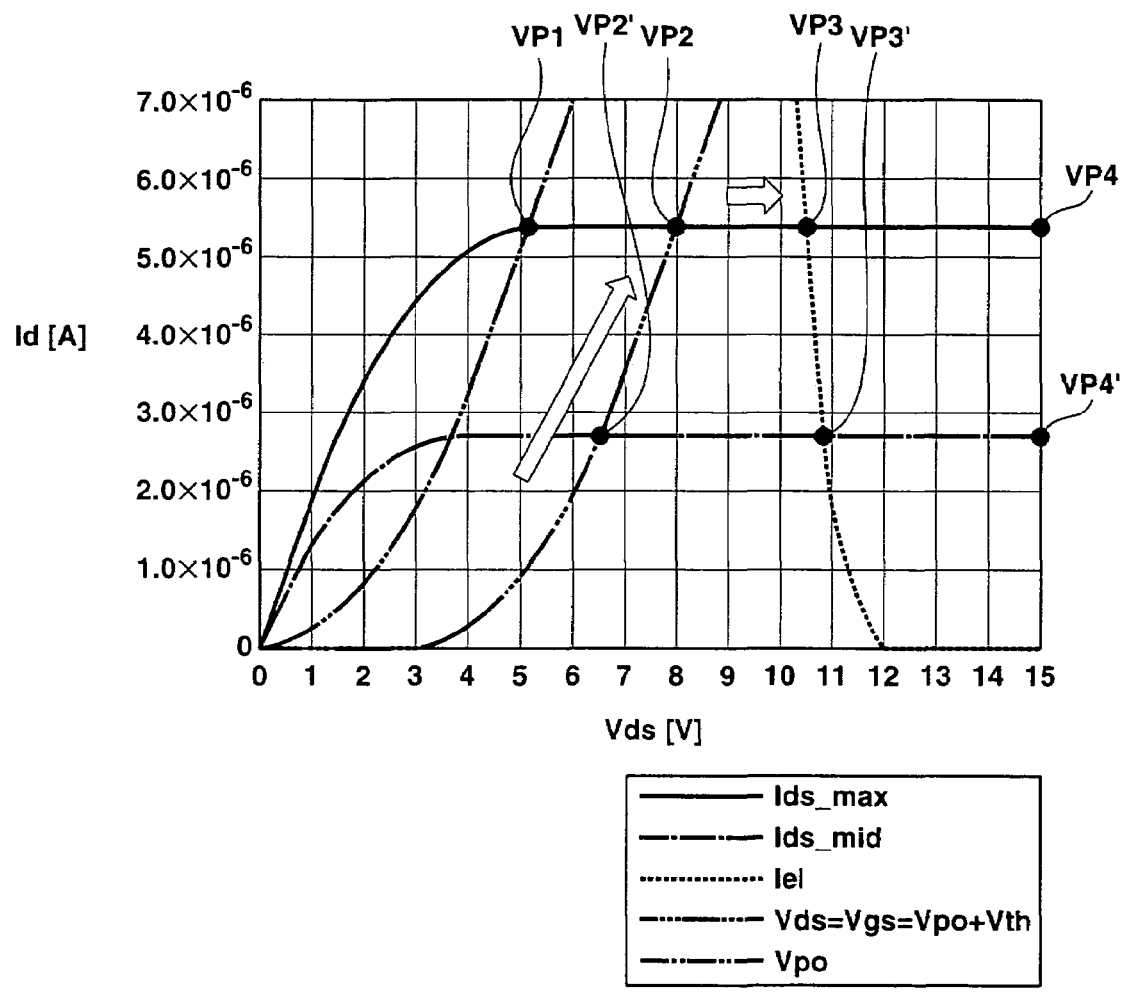
FIG. 9 is a graph showing the current vs. voltage characteristic of a driving transistor 23 and organic EL element 20 of each sub-pixel.

When the display panel 1 has pixels corresponding to WXGA (768×1366), the desired width and sectional area of the feed interconnection 90 and common interconnection 91 are defined. FIG. 9 is a graph showing the current vs. voltage characteristic of the driving transistor 23 and organic EL element 20 of each sub-pixel.

Referring to FIG. 9, the ordinate represents the current value of the write current flowing between the source 23s and drain 23d of one driving transistor 23 or the current value of the driving current flowing between the anode and cathode of one organic EL element 20. The abscissa represents the voltage between the drain 23d and source 23s of one driving transistor 23 (also the voltage between the gate 23g and drain 23d of one driving transistor 23). Referring to FIG. 9, a solid line Ids max indicates a write current and driving current for the highest luminance gray level (brightest display). A one-dot dashed line Ids mid indicates a write current and driving current for an intermediate highest luminance gray level between the highest luminance gray level and the lowest luminance gray level. A two-dots dashed line Vpo indicates a threshold value between the unsaturation region (linear region) and the saturation region of the driving transistor 23, i.e., the pinch-off voltage. A three-dots dashed line Vds indicates a write current flowing between the source 23s and drain 23d of the driving transistor 23. A dot line Iel indicates a driving current flowing between the anode and cathode of the organic EL element 20.

A voltage VP1 is the pinch-off voltage of the driving transistor 23 for the highest luminance gray level. A voltage VP2 is the drain-to-source voltage of the driving transistor 23 when a write current for the highest luminance gray level flows. A voltage VELmax (voltage VP4–voltage VP3) is the anode-to-cathode voltage when the organic EL element 20 emits light by a driving current of the highest luminance gray level, which has a current value equal to that of the write current for the highest luminance gray level. A voltage VP2' is the drain-to-source voltage of the driving transistor 23 when a write current for the intermediate luminance gray level flows. A voltage (voltage VP4'–voltage VP3') is the anode-to-cathode voltage when the organic EL element 20 emits light by a driving current of the intermediate luminance gray level, which has a current value equal to that of the write current for the intermediate luminance gray level.

To drive the driving transistor 23 and organic EL element 20 in the saturation region, a value VX obtained by subtracting (the voltage Vcom of the common interconnection 91 in the light emission period) from (the driving feed voltage VH of the feed interconnection 90 in the light emission period) satisfies $$VX=Vpo+Vth+Vm+VEL \quad (2)$$

where Vth (=VP2–VP1 for the highest luminance) is the threshold voltage of the driving transistor 23, VEL (=VEmax for the highest luminance) is the anode-to-cathode voltage of the organic EL element 20, and Vm is an allowable voltage which displaces in accordance with the gray level.

As is apparent from FIG. 9, of the voltage VX, the higher the luminance gray level is, the higher the voltage (Vpo+Vth) necessary between the source and drain of the transistor 23 is, and also, the higher the voltage VEL necessary between the anode and cathode of the organic EL element 20 is. Hence, the allowable voltage Vm becomes low as the luminance gray level becomes high. A minimum allowable voltage Vmmin is VP3–VP2.

The organic EL element 20 generally degrades and increases its resistance over time no matter whether a low or high molecular weight EL material. It has been confirmed that the anode-to-cathode voltage after 10,000 hrs is about 1.4 to several times that in the initial state. That is, the voltage VEL rises along with the elapse of time even when the luminance gray level does not change. The operation is stable for a long time when the allowable voltage Vm in the initial driving state is as high as possible. Hence, the voltage VX is set such that the voltage VEL becomes 8 V or more and, more preferably, 13 V or more.

The allowable voltage Vm includes not only the increase amount of the resistance of the organic EL element 20 but also the voltage drop by the feed interconnection 90.

If the voltage drop is large because of the interconnection resistance of the feed interconnection 90, the power consumption of the EL display panel 1 considerably increases. Hence, the voltage drop of the feed interconnection 90 is especially preferably set to 1 V or less.

A pixel width Wp as the row-direction length of one pixel, the number of pixels (1366) in the row direction, the extension portion from the first lead interconnection to one interconnection terminal outside the pixel region, and the extension portion from the first lead interconnection to the other interconnection terminal outside the pixel region are taken into consideration. In this case, the total length of the first lead interconnection is 706.7 mm for the display panel 1 with a panel size of 32 inches and 895.2 mm for 40 inches. If a line width WL of the feed interconnection 90 and common interconnection 91 is large, the area of the organic EL layer 20b decreases structurally. In addition, the overlap parasitic capacitance to other interconnections is also generated, and the voltage drop becomes larger. To prevent this, the line width WL of the feed and common interconnections 90, 91 is preferably suppressed to 1/3 or less the pixel width Wp. In consideration of this, the line width WL is 34 µm or less for the display panel 1 with a panel size of 32 inches and 44 µm or less for 40 inches. A maximum thickness Hmax of the feed interconnection 90 and common interconnection 91 is 1.5 times the minimum process size (4 µm) of the first to third transistors 21 to 23, i.e., 6 µm when the aspect ratio is taken into consideration. A maximum sectional area Smax of the feed interconnection 90 and common interconnection 91 is 204 µm² for 32 inches and 264 µm² for 40 inches.

Figure 10:
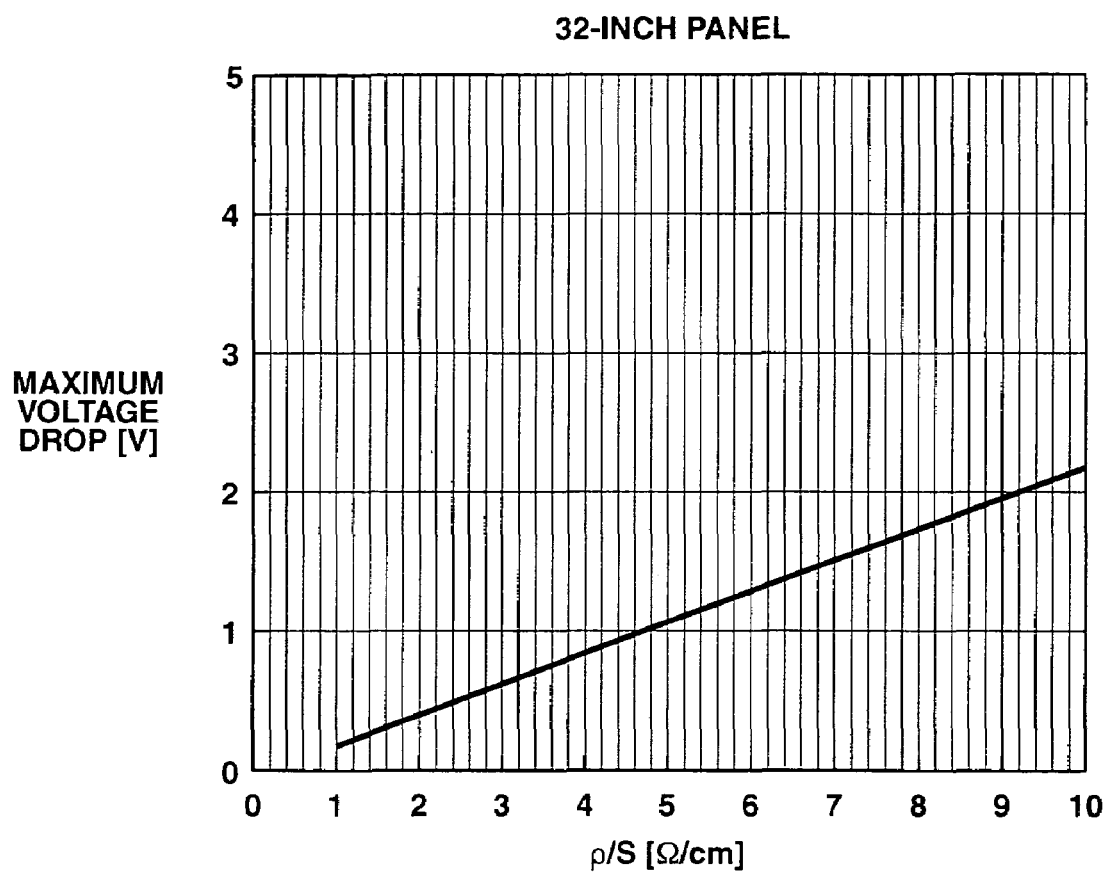
FIG. 10 is a graph showing the correlation between the maximum voltage drop and the interconnection resistivity $\rho$/sectional area S of a feed interconnection 90 and common interconnection 91 of a 32-inch display panel 1.
Figure 11:
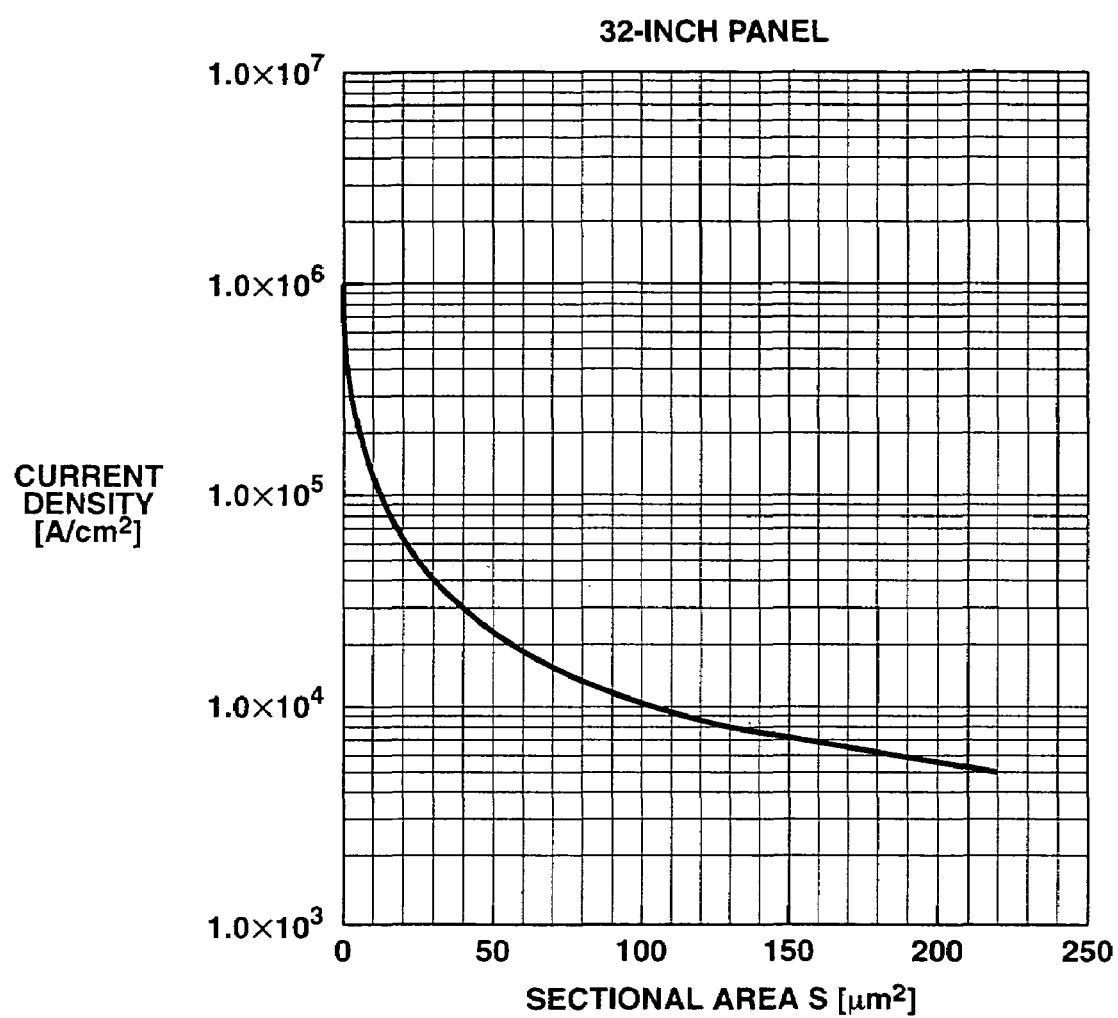
FIG. 11 is a graph showing the correlation between the sectional area and the current density of the feed interconnection 90 and common interconnection 91 of the 32-inch display panel 1.

To make the maximum voltage drop of the feed interconnection 90 and common interconnection 91 1 V or less when the 32-inch display panel 1 is fully lighted to flow the maximum current, an interconnection resistivity ρ/sectional area S of the feed interconnection 90 and common interconnection 91 must be set to 4.7 Ω/cm or less, as shown in FIG. 10. FIG. 11 shows the correlation between the sectional area and the current density of the feed interconnection and common interconnection of the 32-inch display panel 1. The resistivity allowed when the above-described feed interconnection 90 and common interconnection 91 have the maximum sectional area Smax is 9.6 µΩcm for 32 inches and 6.4 µΩcm for 40 inches.

Figure 12:
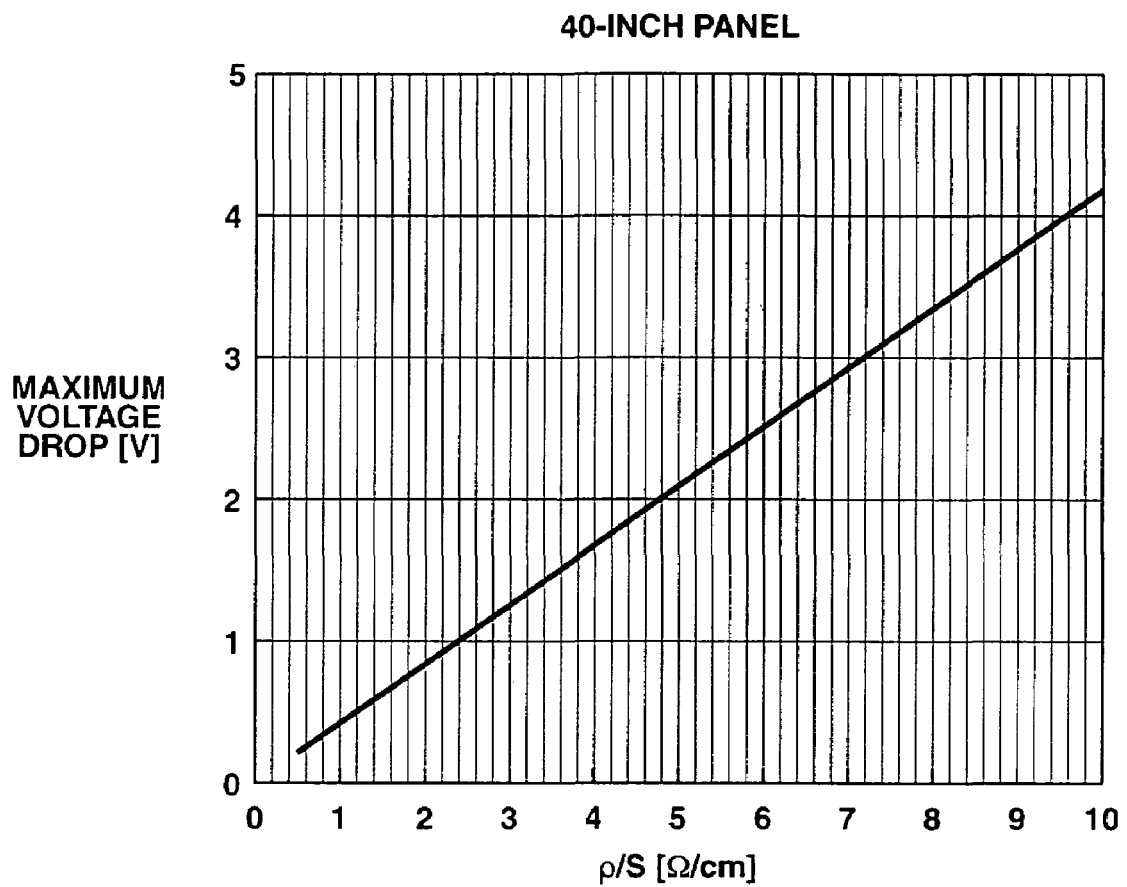
FIG. 12 is a graph showing the correlation between the maximum voltage drop and the interconnection resistivity $\rho$/sectional area S of the feed interconnection 90 and common interconnection 91 of a 40-inch display panel 1.
Figure 13:
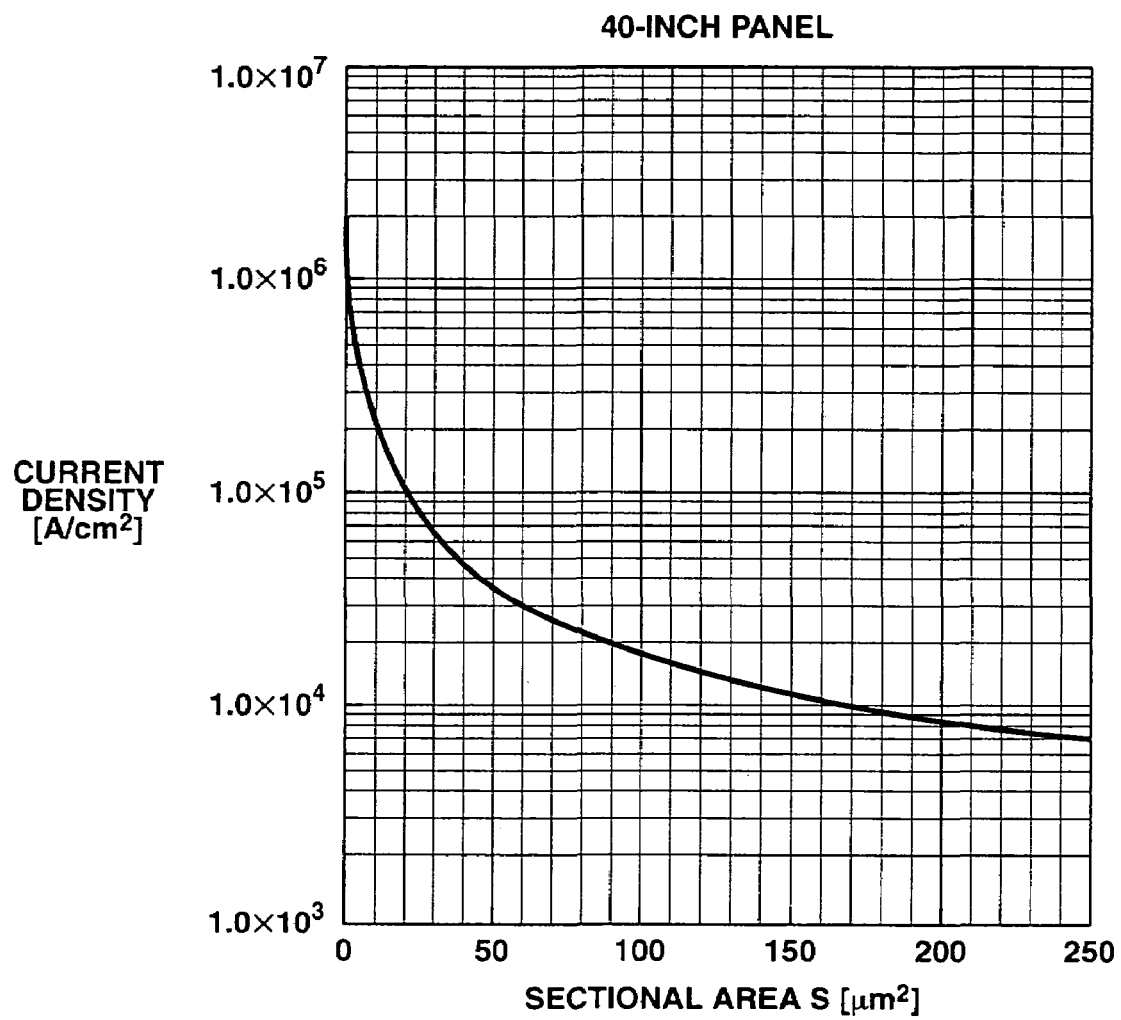
FIG. 13 is a graph showing the correlation between the sectional area and the current density of the feed interconnection 90 and common interconnection 91 of the 40-inch display panel 1.

To make the maximum voltage drop of the feed interconnection 90 and common interconnection 91 1 V or less when the 40-inch display panel 1 is fully lighted to flow the maximum current, the interconnection resistivity ρ/sectional area S of the feed interconnection 90 and common interconnection 91 must be set to 2.4 Ω/cm or less, as shown in FIG. 12. FIG. 13 shows the correlation between the sectional area and the current density of the feed interconnection and common interconnection of the 40-inch display panel 1.

A median time to failure MTF at which the EL display panel stops operation due to a failure in the feed interconnection 90 and common interconnection 91 satisfies $$MTF=A\exp(Ea/K_bT)/\rho J^2 \quad (3)$$

where Ea is an activation energy, $K_bT=8.617\times10^{-5}$ eV, ρ is the resistivity of the feed interconnection 90 and common interconnection 91, and J is a current density.

The median time to failure MTF of the feed interconnection 90 and common interconnection 91 is determined by an increase in resistivity or electromigration. When the feed and common interconnections 90, 91 are set to an Al-based material (Al single substance or an alloy such as AlTi or AlNd), and calculation is done on trial for MTF of 10,000 hrs and an operation temperature of 85° C., the current density J must be $2.1\times10^4$ A/cm² or less. When the feed interconnection 90 and common interconnection 91 are set to Cu, the current density J must be $2.8\times10^6$ A/cm² or less. It is assumed that materials except Al in an Al alloy have a resistivity lower than Al.

In consideration of these, in the 32-inch display panel 1, the sectional area S of the Al-based feed interconnection 90 and common interconnection 91 must be 57 µm² or more to prevent any failure in them in the full lighting state for 10,000 hrs, as shown in FIG. 11. The sectional area S of the feed interconnection 90 and common interconnection 91 made of Cu must be 0.43 µm² or more, as shown in FIG. 11.

In the 40-inch display panel 1, the sectional area S of the Al-based feed interconnection 90 and common interconnection 91 must be 92 µm² or more to prevent any failure in them in the full lighting state for 10,000 hrs, as shown in FIG. 13. The sectional area S of the feed and common interconnections 90, 91 made of Cu must be 0.69 µm² or more, as shown in FIG. 13.

In the 32-inch display panel 1, the interconnection resistivity ρ/sectional area S of the Al-based feed interconnection 90 and common interconnection 91 is 4.7 Ω/cm or less, as described above, assuming that the resistivity of the Al-based material is 4.00 μΩcm. Hence, a minimum sectional area Smin is 85.1 μm². Since the line width WL of the feed and common interconnections 90, 91 is 34 μm or less, as described above, a minimum thickness Hmin of both interconnections 90, 91 is 2.50 μm.

In the 40-inch display panel 1, the interconnection resistivity ρ/sectional area S of the Al-based feed interconnection 90 and common interconnection 91 is 2.4 Ω/cm or less, as described above. Hence, the minimum sectional area Smin is 167 μm². Since the line width WL of the interconnections 90, 91 is 44 μm or less, as described above, the minimum thickness Hmin of the interconnections 90, 91 is 3.80 μm.

In the 32-inch display panel 1, the interconnection resistivity ρ/sectional area S of the feed interconnection 90 and common interconnection 91 made of Cu is 4.7 Ω/cm or less, as described above, assuming that the resistivity of Cu is 2.10 μΩcm. Hence, the minimum sectional area Smin is 44.7 μm². Since the line width WL of both interconnections 90, 91 is 34 μm or less, as described above, the minimum thickness Hmin of the interconnections 90, 91 is 1.31 μm.

In the 40-inch display panel 1, the interconnection resistivity ρ/sectional area S of the feed interconnection 90 and common interconnection 91 made of Cu is 2.4 Ω/cm or less, as described above. Hence, the minimum sectional area Smin is 87.5 μm². Since the line width WL of both interconnections 90, 91 is 44 μm or less, as described above, the minimum thickness Hmin of the interconnections 90, 91 is 1.99 μm.

Hence, to cause the display panel 1 to operate normally at a low power consumption, the voltage drop in the feed interconnection 90 and common interconnection 91 is preferably set to 1 V or less. To set such a condition, in a 32-inch panel in which the feed interconnection 90 and common interconnection 91 are made of an Al-based material, a thickness H is 2.5 to 6.0 μm, the width WL is 14.1 to 34.0 μm, and the resistivity is 4.0 to 9.6 μΩcm. In a 40-inch panel in which both interconnections 90, 91 are made of an Al-based material, the thickness H is 3.8 to 6.0 μm, the width WL is 27.8 to 44.0 μm, and the resistivity is 4.0 to 9.6 μΩcm.

In general, for the Al-based feed interconnection 90 and common interconnection 91, the thickness H is 2.5 to 6.0 μm, the width WL is 14.1 to 44.0 μm, and the resistivity is 4.0 to 9.6 μΩcm.

In a 32-inch panel in which the feed interconnection 90 and common interconnection 91 are made of Cu, the thickness H is 1.31 to 6.00 μm, the width WL is 7.45 to 34.00 μm, and the resistivity is 2.1 to 9.6 μΩcm. In a 40-inch panel in which both interconnections 90, 91 are made of Cu, the thickness H is 1.99 to 6.00 μm, the width WL is 14.6 to 44.0 μm, and the resistivity is 2.1 to 9.6 μΩcm.

In general, for the feed interconnection 90 and common interconnection 91 made of Cu, the thickness H is 1.31 to 6.00 μm, the width WL is 7.45 to 44.00 μm, and the resistivity is 2.1 to 9.6 μΩcm.

Hence, when an Al-based material or Cu is used for the feed interconnection 90 and common interconnection 91, interconnections 90, 91 of the EL display panel 1 have the thickness H of 1.31 to 6.00 μm, the width WL of 7.45 to 44.00 μm, and the resistivity of 2.1 to 9.6 μΩcm.

As described above, the common interconnections 91 formed to project between the lines of the red sub-pixels Pr and the lines of the green sub-pixels Pg in the horizontal direction are formed from a layer different from the electrodes of the first to third transistors 21 to 23. Hence, the common interconnections 91 can be made thick and have a low resistance. The common interconnections 91 having a low resistance are electrically connected to the counter electrode 20c. For this reason, even when the counter electrode 20c itself becomes thin and increases its resistance, the voltage of the counter electrode 20c can be uniformed in a plane. Hence, even if the same potential is applied to all the sub-pixel electrodes 20a, the light emission intensities of the organic EL layers 20b almost equal, and the light emission intensity in a plane can be uniformed.

When the display panel 1 is used as a top emission type, the counter electrode 20c can be made thinner. Hence, light emitted from the organic EL layer 20b hardly attenuates while passing through the counter electrode 20c. Additionally, since the common interconnections 91 are provided between the sub-pixel electrodes 20a adjacent in the vertical direction when viewed from the upper side (FIG. 1), the decrease in pixel opening ratio can be minimized.

In addition, the select interconnections 89 formed to project between the lines of the green sub-pixels Pg and the lines of the blue sub-pixels Pb in the horizontal direction are formed from a layer different from the electrodes of the first to third transistors 21 to 23. Hence, the select interconnections 89 can be made thick and have a low resistance. The common interconnections 91 having a low resistance are formed on the thin scan lines X. For this reason, the voltage drop in the scan lines X can be suppressed, and the signal delay in the scan lines X and select interconnections 89 can be suppressed. That is, when a focus is placed on the column of the sub-pixels P in the horizontal direction, the shift pulse changes to high level in all the sub-pixels P without any delay.

Since the select interconnections 89 are made thick to decrease the resistance, the select interconnections 89 can be made narrow. For this reason, the decrease in pixel opening ratio can be minimized.

Furthermore, the feed interconnections 90 formed to project between the lines of the blue sub-pixels Pb and the lines of the red sub-pixels Pr in the horizontal direction are formed from a layer different from the electrodes of the transistors 21 to 23. Hence, the feed interconnections 90 can be made thick and have a low resistance. The feed interconnections 90 having a low resistance are formed on the thin supply lines Z. For this reason, the voltage drop in the supply lines Z can be suppressed, and the signal delay in the supply lines Z and feed interconnections 90 can be suppressed. For example, when the size of the display panel 1 is increased without the feed interconnections 90, the light emission intensity in a plane may vary due to the voltage drop in the supply lines Z, or some organic EL elements 20 cannot emit light. In this embodiment, however, since the feed interconnections 90 having a low resistance are electrically connected to the supply lines Z, the light emission intensity in a plane can be prevented from varying, and the organic EL elements 20 which cannot emit light can be eliminated.

Since the feed interconnections 90 are made thick to decrease the resistance, the feed interconnections 90 can be made narrow. For this reason, the decrease in pixel opening ratio can be minimized.

Since the select interconnections 89, feed interconnections 90, and common interconnections 91 formed to project are provided thick, the organic EL layers 20b can have different colors by wet coating. Hence, no special banks to partition the sub-pixels P need be provided, and the display panel 1 can easily be manufactured.

[First Modification]

The present invention is not limited to the above-described embodiment, and various changes and modifications can be made without departing from the spirit and scope of the present invention.

In the above-described embodiment, the first to third transistors 21 to 23 have been explained as N-channel field effect transistors. The transistors 21 to 23 may be P-channel field effect transistors. In this case, the relationship between the sources 21s, 22s, and 23s of the transistors 21 to 23 and the drains 21d, 22d, and 23d of the transistors 21 to 23 is reversed in the circuit diagram shown in FIG. 2. For example, when the driving transistor 23 is a P-channel field effect transistor, the drain 23d of the driving transistor 23 is electrically connected to the sub-pixel electrode 20a of the organic EL element 20. The source 23s is electrically connected to the supply line Z.

[Second Modification]

In the above-described embodiment, the three transistors 21 to 23 are provided per 1-dot pixel. The present invention can be applied to any display panel which has one or more driving transistors per 1-dot sub-pixel P and can be driven by using these transistors by an active driving method independently of the number of transistors and whether the panel is current-driven or voltage-driven.

[Third Modification]

In the above-described embodiment, the select interconnections 89 are formed to project between the rows of the green sub-pixels Pg and the rows of the blue sub-pixels Pb. However, instead of the select interconnections 89, common interconnections like the common interconnections 91 may be formed between the rows of the green sub-pixels Pg and the rows of the blue sub-pixels Pb. Therefore, two common interconnections are formed every pixel 3 In this case, no trench 35 is formed under the common interconnection. The common interconnection is insulated from the scan line X. The surface of the common interconnection is coated with a liquid repellent conductive layer like the liquid repellent conductive layer 55. The common interconnection is electrically connected to the counter electrode 20c.

[Fourth Modification]

In the above-described embodiment, the signal line Y is patterned from the gate layer. Instead, the signal line Y may be patterned from the drain layer. In this case, the scan line X and supply line Z are patterned from the gate layer, and the signal line Y is arranged above the scan line X and supply line Z.

[Fifth Modification]

In the above-described embodiment, the common interconnection 91 is arranged between the red sub-pixel Pr and green sub-pixel Pg which are adjacent in the vertical direction. The scan line X and select interconnection 89 are arranged between the green sub-pixel Pg and blue sub-pixel Pb which are adjacent in the vertical direction. The supply line Z and feed interconnection 90 are arranged between the blue sub-pixel Pb of one of the pixels 3 and the red sub-pixel Pr of the adjacent pixel 3. Hence, the organic EL layer 20b of the red sub-pixel Pr, the organic EL layer 20b of the green sub-pixel Pg, and the organic EL layer 20b of the blue sub-pixel Pb are repeatedly arrayed in this order. That is, in the above-described embodiment, the supply line Z and feed interconnection 90, the common interconnection 91, and the scan line X and select interconnection 89 are repeatedly arrayed in this order. In other words, the organic EL layer 20b of the red sub-pixel Pr, the organic EL layer 20b of the green sub-pixel Pg, and the organic EL layer 20b of the blue sub-pixel Pb are repeatedly arrayed in this order. However, they need not always be arrayed in this order. Instead, the scan line X and select interconnection 89, or the supply line Z and feed interconnection 90 may be arranged between the red sub-pixel Pr and green sub-pixel Pg. The common interconnection 91, or the supply line Z and feed interconnection 90 may be arranged between the green sub-pixel Pg and blue sub-pixel Pb. The common interconnection 91, or the scan line X and select interconnection 89 may be arranged between the blue sub-pixel Pb of one of the pixels 3 and the red sub-pixel Pr of the adjacent pixel 3.

A plurality of modifications described above may be combined.

What is claimed is:

1. A display panel comprising:
   a transistor array substrate which includes a plurality of pixels and comprises a plurality of transistors for each pixel, each of the transistors including a gate, a gate insulating film, a source, and a drain;
   a plurality of interconnections which are formed to project from a surface of the transistor array substrate, and which are arrayed in parallel to each other;
   a plurality of pixel electrodes for the plurality of pixels, respectively, the pixel electrodes being arrayed along the interconnections between the interconnections on the surface of the transistor array substrate;
   a plurality of light-emitting layers formed on the pixel electrodes, respectively; and
   a counter electrode which is stacked on the light-emitting layers,
   wherein said plurality of transistors for each pixel include a driving transistor, one of the source and the drain of which is connected to the pixel electrode, a switch transistor which makes a write current flow between the drain and the source of the driving transistor, and a holding transistor which holds a voltage between the gate and source of the driving transistor in a light emission period.

2. A panel according to claim 1, wherein said plurality of interconnections include at least one of a feed interconnection connected to the other of the source and the drain of at least one of the driving transistors, a select interconnection which selects at least one of the switch transistors, and a common interconnection connected to the counter electrode.

3. A panel according to claim 2, wherein each of the light-emitting layers is formed between two of the feed interconnection, the select interconnection, and the common interconnection.

4. A panel according to claim 2, wherein said plurality of interconnections comprises a plurality of sets each including the feed interconnection, the select interconnection, and the common interconnection arrayed in an arbitrary order.

5. A panel according to claim 1, wherein said plurality of pixels include a red pixel, a green pixel, and a blue pixel.

6. A panel according to claim 5, wherein said plurality of pixels comprises a plurality of sets each including the red pixel, the green pixel, and the blue pixel arrayed in an arbitrary order.

7. A panel according to claim 1, wherein at least one of the interconnections has a thickness of 1.31 to 6.00 μm.

8. A panel according to any one of claims 1 or 2 to 7, wherein at least one of the interconnections has a width of 7.45 to 44.00 μm.

9. A panel according to claim 1, wherein at least one of the interconnections has a resistivity of 2.1 to 9.6 μΩcm.

10. A panel according to claim 1, wherein said plurality of interconnections are formed from a conductive layer that is different from a layer forming the source and the drain of each of the transistors and a layer forming the gate of the transistors.

11. A panel according to claim 1, wherein said plurality of interconnections are formed from a conductive layer different from a layer forming the pixel electrodes.

12. A panel according to claim 1, wherein said plurality of interconnections are thicker than a layer forming the source and the drain of each of the transistors and a layer forming the gate of each of the transistors.

13. A panel according to claim 1, wherein said plurality of interconnections are thicker than the pixel electrodes.

14. A display panel comprising:
a plurality of pixel electrodes;
a plurality of light-emitting layers which are provided for said plurality of pixel electrodes, respectively;
a counter electrode which is provided for said plurality of light-emitting layers;
a plurality of driving transistors which are connected to said plurality of pixel electrodes, respectively;
a plurality of switch transistors, each of which supplies a write current between a drain and a source of a corresponding one of said plurality of driving transistors;
a plurality of holding transistors, each of which holds a voltage between a gate and the source of a corresponding one of said plurality of driving transistors;
a plurality of feed interconnections, which are formed from a conductive layer different from layers forming sources, drains, and gates of said plurality of driving transistors, said plurality of switch transistors, and said plurality of holding transistors, and which are connected to the drains of said plurality of driving transistors;
a plurality of select interconnections which the switch transistors; and
a plurality of common interconnections, each of which is connected to the counter electrode.

15. A panel according to claim 14, wherein said plurality of select interconnections are formed from a conductive layer different from the layers forming the sources, drains and gates of said plurality of driving transistors, said plurality of switch transistors, and said plurality of holding transistors.

16. A panel according to claim 14, wherein said plurality of common interconnections are formed from a conductive layer different from the layers forming the sources, drains and gates of said plurality of driving transistors, said plurality of switch transistors, and said plurality of holding transistors.

17. A panel according to claim 14, wherein at least one of the feed interconnections, the select hit interconnections, and the common interconnections are thicker than each of the layers forming the sources, drains and gates of said plurality of driving transistors, said plurality of switch transistors, and said plurality of holding transistors.

18. A panel according to claim 14, wherein at least one of the feed interconnections, the select interconnections, and the common interconnections are formed from a conductive layer different from a layer forming the pixel electrodes.

19. A panel according to claim 14, wherein at least one of the feed interconnections, the select interconnections, and the common interconnections are thicker than the layer forming the pixel electrodes.

20. A display panel comprising:
a plurality of pixel electrodes;
a plurality of light-emitting layers which are provided for said plurality of pixel electrodes, respectively;
a counter electrode which is provided for the light-emitting layers;
a plurality of driving transistors which are connected to said plurality of pixel electrodes, respectively;
a plurality of switch transistors, each of which supplies a write current between a source and a drain of a corresponding one of said plurality of driving transistors;
a plurality of holding transistors, each of which holds a voltage between the source and a gate of a corresponding one of said plurality of driving transistors;
a select interconnection which selects at least one of the switch transistors;
a common interconnection, which is formed from a conductive layer different from a layer forming sources and drains and a layer forming gates of the driving transistors, the switch transistors, and the holding transistors, and which is connected to the counter electrode; and
a feed interconnection, which is formed from a conductive layer different from the layers forming the sources, drains, and gates of the driving transistors, the switch transistors, and the holding transistors, and which is connected to the drains of the driving transistors and is thicker than the common interconnection.

21. A display panel comprising:
a transistor array substrate which comprises a plurality of transistors for each pixel, each transistor having a gate, a gate insulating film, and a source/drain;
a plurality of pixel electrodes which are provided in a plurality of rows on the transistor array substrate;
a first light-emitting layer which is provided on each of said plurality of pixel electrodes of a first row to emit light of a first color;
a second light-emitting layer which is provided on each of said plurality of pixel electrodes of a second row to emit light of a second color;
a third light-emitting layer which is provided on each of said plurality of pixel electrodes of a third row to emit light of a third color;
a counter electrode which is provided on the first light-emitting layer, the second light-emitting layer, and the third light-emitting layer;
a select interconnection, which has a top that is higher than the first light-emitting layer, the second light-emitting layer, and the third light-emitting layer, and which selects at least one of said plurality of transistors;
a common interconnection, which has a top that is higher than the first light-emitting layer, the second light-emitting layer, and the third light-emitting layer, and which is connected to the counter electrode; and
a feed interconnection which has a top that is higher than the first light-emitting layer, the second light-emitting layer, and the third light-emitting layer, and which is connected to said plurality of pixel electrodes.

22. A panel according to claim 21, wherein:
the first light-emitting layer is sandwiched between two of the select interconnection, the common interconnection, and the feed interconnection;
the second light-emitting layer is sandwiched between two of the select interconnection, the common interconnection, and the feed interconnection, whose combination is different from the two interconnections sandwiching the first light-emitting layer; and
the third light-emitting layer is sandwiched between two of the select interconnection, the common interconnection, and the feed interconnection, whose combination is different from the two interconnections sandwiching the first light-emitting layer and the two interconnections sandwiching the second light-emitting layer.

* * * * *